United States Patent
Abotabl et al.

(10) Patent No.: US 11,824,655 B2
(45) Date of Patent: Nov. 21, 2023

(54) REPORTING DIFFERENCE BETWEEN HALF-DUPLEX AND FULL-DUPLEX CHANNEL QUALITIES VIA LOW-DENSITY PARITY-CHECK DECODER PARAMETERS

(71) Applicant: QUALCOMM Incorporated, San Diego, CA (US)

(72) Inventors: Ahmed Attia Abotabl, San Diego, CA (US); Muhammad Sayed Khairy Abdelghaffar, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 12 days.

(21) Appl. No.: 17/645,652

(22) Filed: Dec. 22, 2021

(65) Prior Publication Data

US 2023/0198667 A1    Jun. 22, 2023

(51) Int. Cl.
| | | |
|---|---|---|
| H03M 13/00 | (2006.01) | |
| H04L 1/00 | (2006.01) | |
| H04L 5/14 | (2006.01) | |
| H03M 13/25 | (2006.01) | |
| H04W 72/23 | (2023.01) | |

(52) U.S. Cl.
CPC ........ *H04L 1/0063* (2013.01); *H03M 13/255* (2013.01); *H04L 1/0057* (2013.01); *H04L 1/0073* (2013.01); *H04L 5/14* (2013.01); *H04W 72/23* (2023.01)

(58) Field of Classification Search
None
See application file for complete search history.

(56) References Cited

U.S. PATENT DOCUMENTS

| | | | |
|---|---|---|---|
| 11,419,124 B2* | 8/2022 | Yeh | ............ H04J 11/0026 |
| 2008/0301527 A1* | 12/2008 | Graef | ............ H03M 13/1105 |
| | | | 714/764 |
| 2015/0003557 A1* | 1/2015 | Perry | ............ H04L 1/08 |
| | | | 375/285 |
| 2017/0054544 A1 | 2/2017 | Kazmi et al. | |

(Continued)

FOREIGN PATENT DOCUMENTS

WO    WO-2021133974 A1    7/2021

OTHER PUBLICATIONS

International Search Report and Written Opinion—PCT/US2022/079917—ISA/EPO—dated Feb. 15, 2023.

(Continued)

*Primary Examiner* — Mujtaba M Chaudry
(74) *Attorney, Agent, or Firm* — Harrity & Harrity, LLP/Qualcomm Incorporated

(57) ABSTRACT

Various aspects of the present disclosure generally relate to wireless communication. In some aspects, a user equipment (UE) may receive, from a base station, a physical downlink shared channel (PDSCH) transmission in one or more of a half-duplexing mode or a full-duplexing mode. The UE may attempt to decode the PDSCH transmission using a low-density parity-check (LDPC) decoder. The UE may transmit, to the base station, feedback that indicates a difference between a half-duplex channel quality and a full-duplex channel quality based at least in part on one or more decoding parameters associated with the LDPC decoder. Numerous other aspects are described.

30 Claims, 10 Drawing Sheets

(56) References Cited

U.S. PATENT DOCUMENTS

2019/0349945 A1* 11/2019 Yeh .......................... H04L 5/14

OTHER PUBLICATIONS

Nokia., et al., "CSI Feedback Enhancements for URLLC/IIoT Use Cases", 3GPP TSG RAN WG1 #105-e, R1-2105580, 3rd Generation Partnership Project (3GPP), Mobile Competence Centre, 650, Route Des Lucioles, F-06921 Sophia-Antipolis Cedex, France, vol. RAN WG1, No. e-Meeting, May 10, 2021-May 27, 2021, May 12, 2021, 18 Pages, XP052011539, Section 1 "Introduction", p. 1-2, Section 4 "Case 2 New Reporting, Additional UE Measurements to Improve (outer-loop) Link Adaptation Accuracy", p. 8-10.

* cited by examiner

REPORTING DIFFERENCE BETWEEN HALF-DUPLEX AND FULL-DUPLEX CHANNEL QUALITIES VIA LOW-DENSITY PARITY-CHECK DECODER PARAMETERS

FIELD OF THE DISCLOSURE

Aspects of the present disclosure generally relate to wireless communication and to techniques and apparatuses for reporting a difference between half-duplex and full-duplex channel qualities via low-density parity-check (LDPC) decoder parameters.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a user equipment (UE). The method may include receiving, from a base station, a physical downlink shared channel (PDSCH) transmission in one or more of a half-duplexing mode or a full-duplexing mode. The method may include attempting to decode the PDSCH transmission using a low-density parity-check (LDPC) decoder. The method may include transmitting, to the base station, feedback that indicates a difference between a half-duplex channel quality and a full-duplex channel quality based at least in part on one or more decoding parameters associated with the LDPC decoder.

Some aspects described herein relate to a method of wireless communication performed by a base station. The method may include transmitting, to a UE, a first PDSCH transmission in one or more of a half-duplexing mode or a full-duplexing mode. The method may include receiving, from the UE, feedback that indicates a difference between a half-duplex channel quality and a full-duplex channel quality based at least in part on one or more decoding parameters associated with an LDPC decoder used to decode the first PDSCH. The method may include transmitting, to the UE, a second PDSCH in one or more of the half-duplexing mode or the full-duplexing mode using one or more transmission parameters that are based at least in part on the feedback that indicates the difference between the half-duplex channel quality and the full-duplex channel quality.

Some aspects described herein relate to a UE for wireless communication. The user equipment may include a memory and one or more processors coupled to the memory. The one or more processors may be configured to receive, from a base station, a PDSCH transmission in one or more of a half-duplexing mode or a full-duplexing mode. The one or more processors may be configured to attempt to decode the PDSCH transmission using an LDPC decoder. The one or more processors may be configured to transmit, to the base station, feedback that indicates a difference between a half-duplex channel quality and a full-duplex channel quality based at least in part on one or more decoding parameters associated with the LDPC decoder.

Some aspects described herein relate to a base station for wireless communication. The base station may include a memory and one or more processors coupled to the memory. The one or more processors may be configured to transmit, to a UE, a first PDSCH transmission in one or more of a half-duplexing mode or a full-duplexing mode. The one or more processors may be configured to receive, from the UE, feedback that indicates a difference between a half-duplex channel quality and a full-duplex channel quality based at least in part on one or more decoding parameters associated with an LDPC decoder used to decode the first PDSCH. The one or more processors may be configured to transmit, to the UE, a second PDSCH in one or more of the half-duplexing mode or the full-duplexing mode using one or more transmission parameters that are based at least in part on the feedback that indicates the difference between the half-duplex channel quality and the full-duplex channel quality.

Some aspects described herein relate to a non-transitory computer-readable medium that stores a set of instructions for wireless communication by a UE. The set of instructions, when executed by one or more processors of the UE, may cause the UE to receive, from a base station, a PDSCH transmission in one or more of a half-duplexing mode or a full-duplexing mode. The set of instructions, when executed by one or more processors of the UE, may cause the UE to attempt to decode the PDSCH transmission using an LDPC decoder. The set of instructions, when executed by one or more processors of the UE, may cause the UE to transmit, to the base station, feedback that indicates a difference between a half-duplex channel quality and a full-duplex channel quality based at least in part on one or more decoding parameters associated with the LDPC decoder.

Some aspects described herein relate to a non-transitory computer-readable medium that stores a set of instructions for wireless communication by a base station. The set of instructions, when executed by one or more processors of the base station, may cause the base station to transmit, to a UE, a first PDSCH transmission in one or more of a half-duplexing mode or a full-duplexing mode. The set of instructions, when executed by one or more processors of the base station, may cause the base station to receive, from the UE, feedback that indicates a difference between a half-duplex channel quality and a full-duplex channel quality based at least in part on one or more decoding parameters associated with an LDPC decoder used to decode the first PDSCH. The set of instructions, when executed by one or more processors of the base station, may cause the base station to transmit, to the UE, a second PDSCH in one or more of the half-duplexing mode or the full-duplexing mode using one or more transmission parameters that are based at least in part on the feedback that indicates the difference between the half-duplex channel quality and the full-duplex channel quality.

Some aspects described herein relate to an apparatus for wireless communication. The apparatus may include means for receiving, from a base station, a PDSCH transmission in one or more of a half-duplexing mode or a full-duplexing mode. The apparatus may include means for attempting to decode the PDSCH transmission using an LDPC decoder. The apparatus may include means for transmitting, to the base station, feedback that indicates a difference between a half-duplex channel quality and a full-duplex channel quality based at least in part on one or more decoding parameters associated with the LDPC decoder.

Some aspects described herein relate to an apparatus for wireless communication. The apparatus may include means for transmitting, to a UE, a first PDSCH transmission in one or more of a half-duplexing mode or a full-duplexing mode. The apparatus may include means for receiving, from the UE, feedback that indicates a difference between a half-duplex channel quality and a full-duplex channel quality based at least in part on one or more decoding parameters associated with an LDPC decoder used to decode the first PDSCH. The apparatus may include means for transmitting, to the UE, a second PDSCH in one or more of the half-duplexing mode or the full-duplexing mode using one or more transmission parameters that are based at least in part on the feedback that indicates the difference between the half-duplex channel quality and the full-duplex channel quality.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

Figure 1:
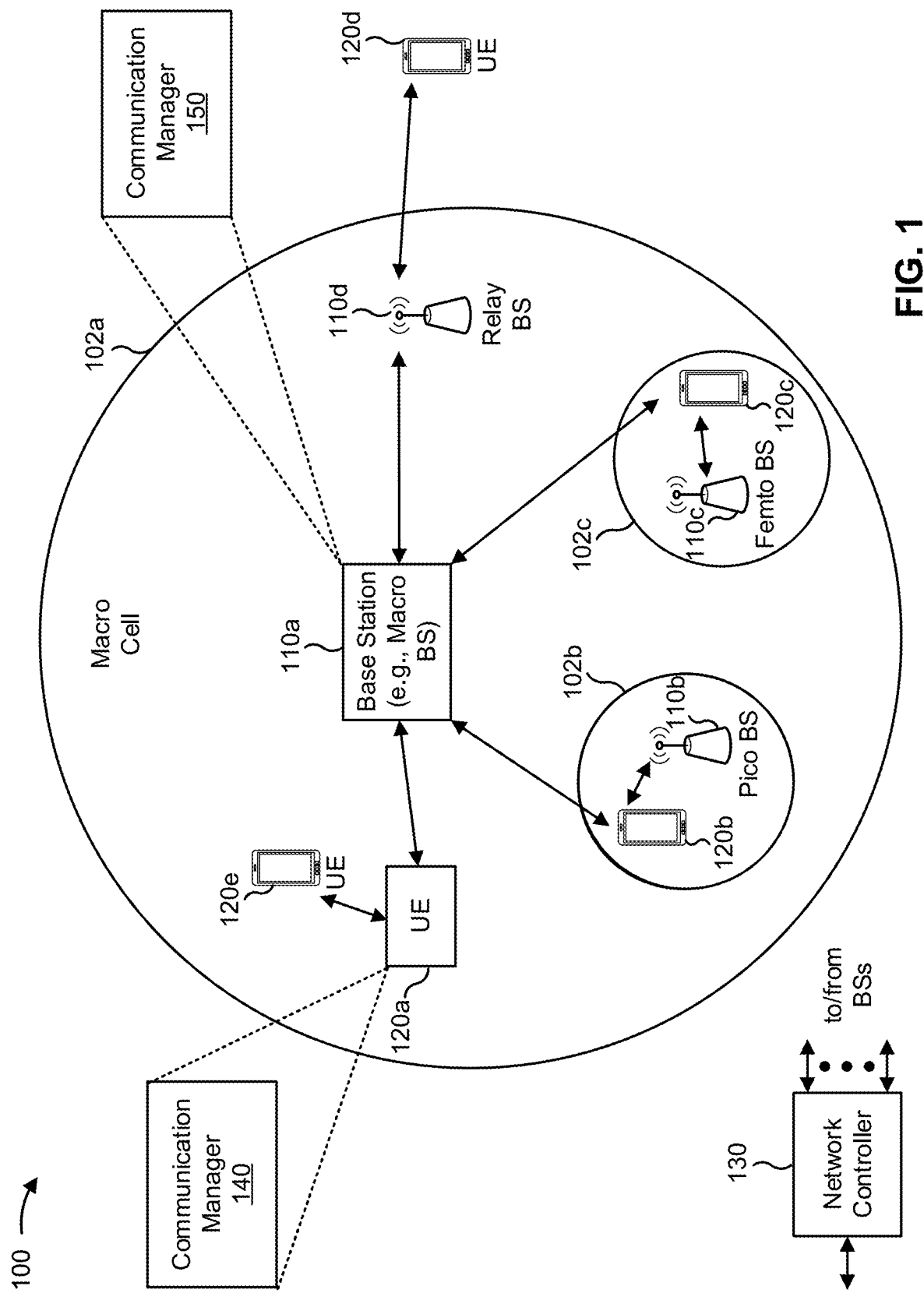
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110a, a BS 110b, a BS 110c, and a BS 110d), a user equipment (UE) 120 or multiple UEs 120 (shown as a UE 120a, a UE 120b, a UE 120c, a UE 120d, and a UE 120e), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. As described in more detail elsewhere herein, the communication manager 140 may receive, from a base station 110, a physical downlink shared channel (PDSCH) transmission in one or more of a half-duplexing mode or a full-duplexing mode; attempt to decode the PDSCH transmission using a low-density parity-check (LDPC) decoder; and transmit, to the base station 110, feedback that indicates a difference between a half-duplex channel quality and a full-duplex channel quality based at least in part on one or more decoding parameters associated with the LDPC decoder. Additionally, or alternatively, the communication manager 140 may perform one or more other operations described herein.

In some aspects, the base station 110 may include a communication manager 150. As described in more detail elsewhere herein, the communication manager 150 may transmit, to a UE 120, a first PDSCH transmission in one or more of a half-duplexing mode or a full-duplexing mode; receive, from the UE 120, feedback that indicates a difference between a half-duplex channel quality and a full-duplex channel quality based at least in part on one or more decoding parameters associated with an LDPC decoder used to decode the first PDSCH; and transmit, to the UE 120, a second PDSCH in one or more of the half-duplexing mode or the full-duplexing mode using one or more transmission parameters that are based at least in part on the feedback that indicates the difference between the half-duplex channel quality and the full-duplex channel quality. Additionally, or alternatively, the communication manager 150 may perform one or more other operations described herein.

As indicated above, FIG. 1 is provided as an example. Other examples may differ from what is described with regard to FIG. 1.

Figure 2:
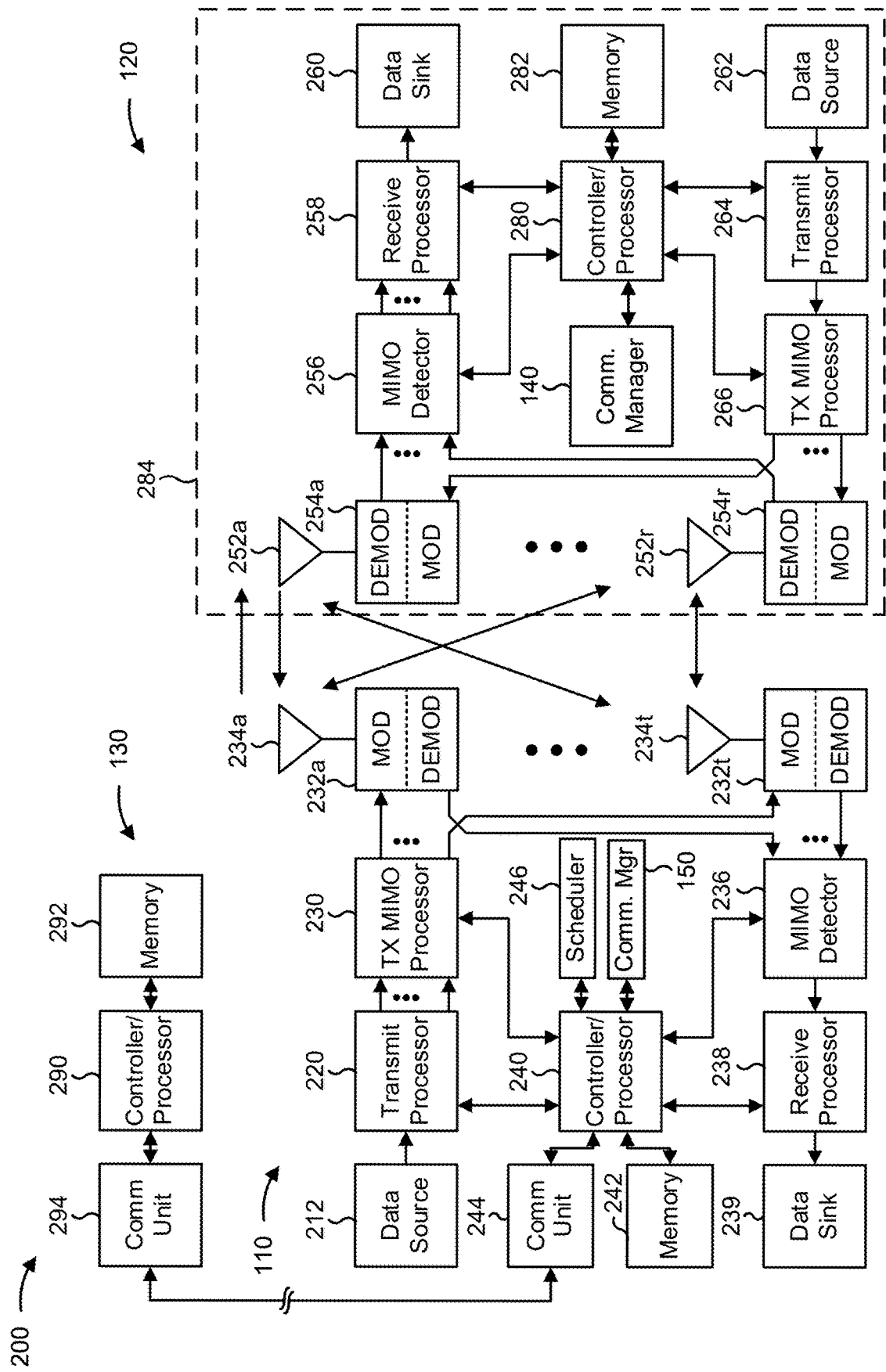
FIG. 2 is a diagram illustrating an example of a base station in communication with a user equipment (UE) in a wireless network, in accordance with the present disclosure.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 6-10).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 6-10).

The controller/processor 240 of the base station 110, the controller/processor 280 of the UE 120, and/or any other component(s) of FIG. 2 may perform one or more techniques associated with reporting a difference between half-duplex and full-duplex channel qualities via low-density parity-check (LDPC) decoder parameters, as described in more detail elsewhere herein. For example, the controller/processor 240 of the base station 110, the controller/processor 280 of the UE 120, and/or any other component(s) of FIG. 2 may perform or direct operations of, for example, process 700 of FIG. 7, process 800 of FIG. 8, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 700 of FIG. 7, process 800 of FIG. 8, and/or other processes as described herein. In some examples, executing instructions may include running the instructions, converting the instructions, compiling the instructions, and/or interpreting the instructions, among other examples.

In some aspects, the UE 120 includes means for receiving, from the base station 110, a physical downlink shared channel (PDSCH) transmission in one or more of a half-duplexing mode or a full-duplexing mode (e.g., using antenna 252, DEMOD 254, MIMO detector 256, receive processor 258, controller/processor 280, memory 282, or the like); means for attempting to decode the PDSCH transmission using an LDPC decoder (e.g., using controller/processor 280, memory 282, or the like); and/or means for transmitting, to the base station 110, feedback that indicates a difference between a half-duplex channel quality and a full-duplex channel quality based at least in part on one or more decoding parameters associated with the LDPC decoder (e.g., using controller/processor 280, transmit processor 264, TX MIMO processor 266, MOD 254, antenna 252, memory 282, or the like). The means for the UE 120 to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the base station 110 includes means for transmitting, to the UE 120, a first PDSCH transmission in one or more of a half-duplexing mode or a full-duplexing mode (e.g., using controller/processor 240, transmit processor 220, TX MIMO processor 230, MOD 232, antenna 234, memory 242, or the like); means for receiving, from the UE 120, feedback that indicates a difference between a half-duplex channel quality and a full-duplex channel quality based at least in part on one or more decoding parameters associated with an LDPC decoder used to decode the first PDSCH (e.g., using antenna 234, DEMOD 232, MIMO detector 236, receive processor 238, controller/processor 240, memory 242, or the like); and/or means for transmitting, to the UE 120, a second PDSCH in one or more of the half-duplexing mode or the full-duplexing mode using one or more transmission parameters that are based at least in part on the feedback that indicates the difference between the half-duplex channel quality and the full-duplex channel quality (e.g., using controller/processor 240, transmit processor 220, TX MIMO processor 230, MOD 232, antenna 234, memory 242, or the like). The means for the base station 110 to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
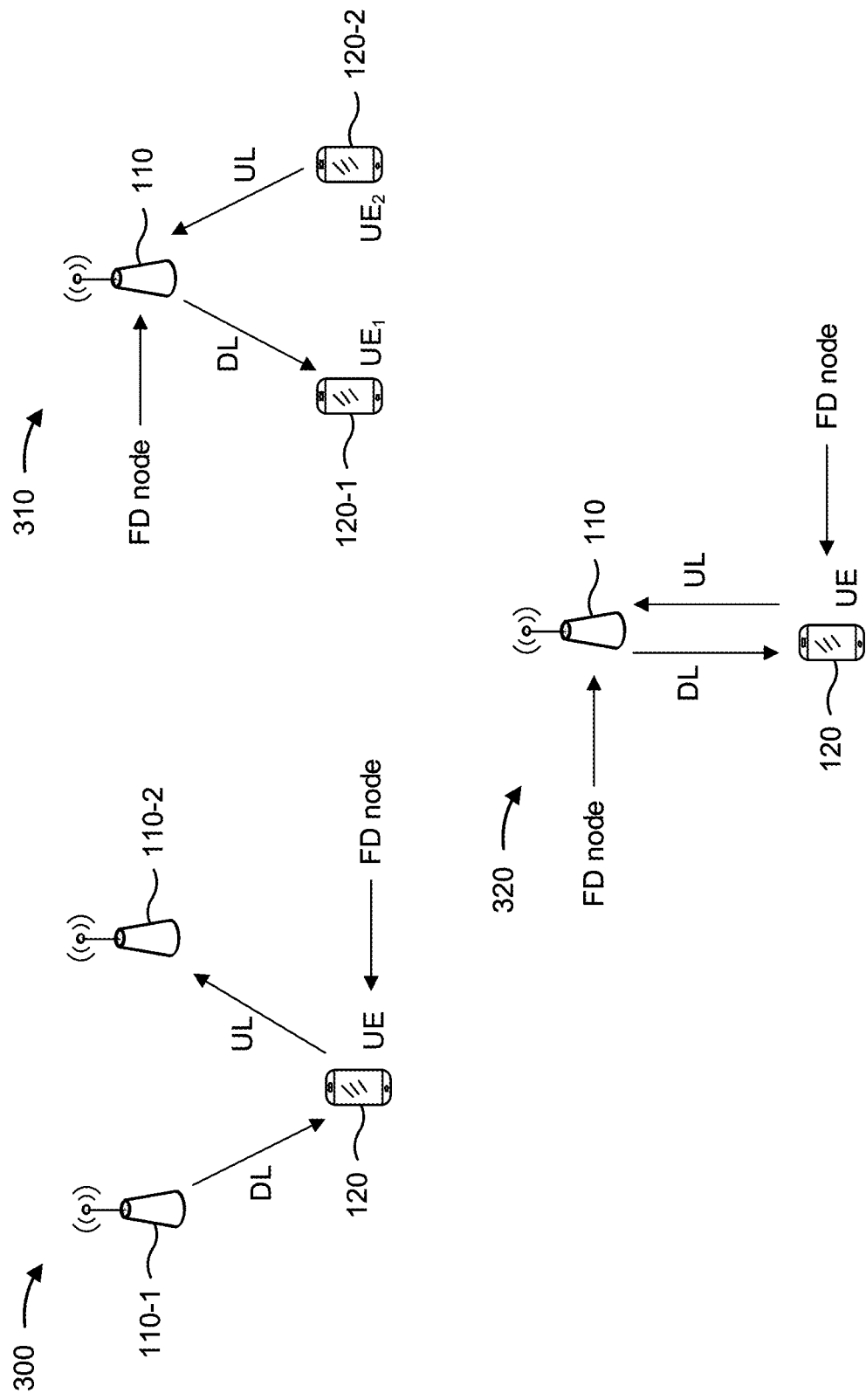
FIG. 3 is a diagram illustrating examples of full-duplex communication, in accordance with the present disclosure.

FIG. 3 is a diagram illustrating examples 300, 310, 320 of full-duplex communication, in accordance with the present disclosure. As shown in FIG. 3, examples 300, 310, 320 include one or more UEs 120 in communication with one or more base stations 110 and/or TRPs 110 in a wireless network that supports full-duplex communication. However, it will be appreciated that the devices shown in FIG. 3 are exemplary only, and that the wireless network may support full-duplex communication between other devices (e.g., between a UE 120 and a base station 110 or a TRP 110, between a mobile termination node and a control node, between an integrated access and backhaul (IAB) child node and an IAB parent node, and/or between a scheduled node and a scheduling node).

As shown in FIG. 3, example 300 includes a UE 120 in communication with two base stations (e.g., TRPs) 110-1, 110-2. As shown in FIG. 3, the UE 120 may transmit one or more uplink transmissions to base station 110-1 and may concurrently receive one or more downlink transmissions from base station 110-2. Accordingly, in example 300, full-duplex communication is enabled for the UE 120, which may be operating as a full-duplex node, but not for the base stations 110-1, 110-2, which may be operating as half-duplex nodes. Additionally, or alternatively, example 310 includes a first UE 120-1 and a second UE 120-2, in communication with a base station 110. In this case, the base station 110 may transmit one or more downlink transmissions to the first UE 120-1 and may concurrently receive one or more uplink transmissions from the second UE 120-2. Accordingly, in example 310, full-duplex communication is enabled for the base station 110, which may be operating as a full-duplex node, but not for the first UE 120-1 and the second UE 120-2, which are operating as half-duplex nodes. Additionally, or alternatively, example 320 includes a UE 120 in communication with a base station 110. In this case, the base station 110 may transmit, and the UE 120 may receive, one or more downlink transmissions concurrently with the UE 120 transmitting, and the base station 110 receiving, one or more uplink transmissions. Accordingly, in the example 320, full-duplex communication is enabled for both the UE 120 and the base station 110, each of which is operating as a full-duplex node.

The present disclosure generally relates to improving the manner in which flexible time division duplexing (TDD) operates to support full-duplex communication, which generally refers to simultaneous downlink and uplink transmissions in unpaired spectrum. Flexible TDD capabilities that support full-duplex communication may be present at a scheduling node (e.g., a base station, a TRP, a control node, and/or a parent node), a scheduled node (e.g., a UE, a mobile termination (MT) node, and/or a child node), or both. For example, at a UE, uplink transmission may be from one antenna panel and downlink reception may be in another antenna panel. In general, full-duplex communication may be conditional on beam separation between an uplink beam and a downlink beam at the respective antenna panels in order to minimize self-interference that may occur when a transmitted signal leaks into a receive port and/or when an object in a surrounding environment reflects a transmitted signal back to a receive port (e.g., causing a clutter echo effect). Accordingly, improving the manner in which transmission parameters are determined or otherwise configured for the uplink and the downlink to enable full-duplex communication is desirable. Utilizing full-duplex communication may provide reduced latency by allowing a UE to receive a downlink signal in an uplink-only slot, or to transmit an uplink signal in a downlink-only slot. In addition, full-duplex communication may enhance spectral efficiency or throughput per cell or per UE and/or enable more efficient resource utilization by simultaneously utilizing time and frequency resources for downlink communication and uplink communication.

As indicated above, FIG. 3 is provided as one or more examples. Other examples may differ from what is described with regard to FIG. 3.

Figure 4:
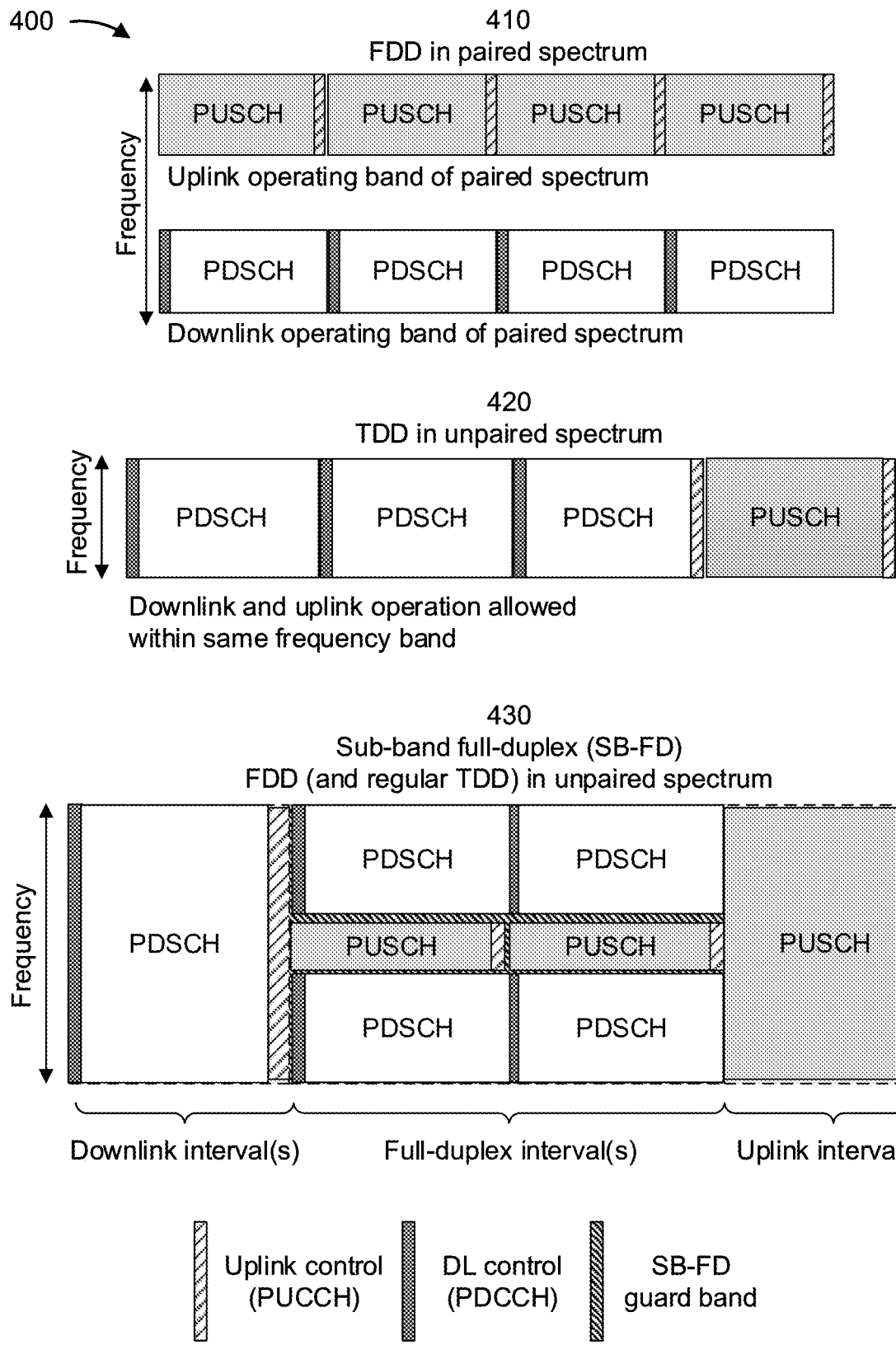
FIG. 4 is a diagram illustrating examples of different duplexing modes, in accordance with the present disclosure.

FIG. 4 is a diagram illustrating examples 410, 420, 430 of different duplexing modes, in accordance with the present disclosure. For example, as described in further detail herein, example 410 illustrates a frequency division duplexing (FDD) mode that may be applied in paired spectrum, example 420 illustrates a TDD mode that may be applied in unpaired spectrum, and example 430 illustrates a sub-band full-duplexing (SBFD) mode that may be applied in unpaired spectrum (e.g., a TDD band).

In some aspects, a wireless communication standard and/or governing body may generally specify one or more duplexing modes in which a wireless spectrum is to be used. For example, 3GPP may specify how wireless spectrum is to be used for the 5G/NR radio access technology and interface. As an example, a specification may indicate whether a band is to be used as paired spectrum in an FDD mode or as unpaired spectrum in a TDD mode.

For example, as shown by example 410, paired spectrum in FDD mode may use a first frequency region (or channel) for uplink communication and a second frequency region (or channel) for downlink communication. In such cases, the frequency regions or channels used for uplink communication and downlink communication do not overlap, have different center frequencies, and have sufficient separation to prevent interference between the downlink communication and the uplink communication. For example, paired spectrum in FDD mode may include an uplink operating band and a downlink operating band that are configured to use non-overlapped frequency regions separated by a guard band. Accordingly, when operating in FDD mode in paired spectrum, a UE with full-duplex capabilities may perform concurrent transmit and receive operations using the separate operating bands allocated to downlink and uplink communication. For example, paired bands in NR include NR operating bands n1, n2, n3, n5, n7, n8, n12, n20, n25, and n28, as specified by 3GPP Technical Specification (TS) 38.101-1.

Alternatively, as shown by example 420, unpaired spectrum in TDD mode may allow downlink and uplink operation within a single frequency region (e.g., a single operating band). For example, when operating in TDD mode in unpaired spectrum, downlink communication and uplink communication may occur in the same frequency range. Some deployments may use TDD in the unpaired band, whereby some transmission time intervals (e.g., frames, slots, and/or symbols) are used for downlink communication only and other transmission time intervals are used for uplink communication only. In this case, substantially the entire bandwidth of a component carrier may be used for downlink communication or uplink communication, depending on whether the communication is performed in a downlink interval, an uplink interval, or a special interval (in which either downlink or uplink communication can be scheduled). Examples of unpaired bands include NR operating bands n40, n41, and n50, as specified by 3GPP TS 38.101-1. In some cases, however, using TDD in unpaired spectrum may be inefficient. For example, uplink transmit power may be limited, meaning that UEs may be incapable of transmitting with enough power to efficiently utilize the full bandwidth of an uplink slot. This may be particularly problematic in large cells at the cell edge. Furthermore, using TDD may introduce latency relative to a full-duplexing mode in which uplink communications and downlink communications can be performed in the same time interval, since TDD restricts usage of a given transmission time interval to uplink communication only or downlink communication only. Furthermore, using TDD may reduce spectral efficiency and/or reduce throughput by restricting usage of a given transmission time interval to uplink or downlink communication only.

Accordingly, as shown by example 430, an unpaired band may be configured in a sub-band full-duplexing (SBFD) mode in order to enable half-duplex operation and/or full-duplex operation in unpaired spectrum (e.g., in a TDD band normally limited to half-duplexing only). For example, as shown in FIG. 4, an unpaired band configured in the SBFD mode may include one or more half-duplex transmission time intervals that are associated with downlink communication only or uplink communication only, and one or more full-duplex transmission time intervals in which both downlink communication and uplink communication are enabled. Each transmission time interval may be associated with a control region, illustrated as a portion of a time interval with a diagonal fill for uplink control (e.g., a physical uplink control channel (PUCCH)) or a darker-shaded fill for downlink control (e.g., a physical downlink control channel (PDCCH)). Additionally, or alternatively, each time interval may be associated with a data region, which is shown as a physical downlink shared channel (PDSCH) for downlink frequency regions or a physical uplink shared channel (PUSCH) for uplink frequency regions.

In some aspects, as described herein, an unpaired band configured in the SB-FD mode may include one or more full-duplex transmission time intervals (e.g., frames, subframes, slots, and/or symbols, among other examples) that support concurrent or simultaneous communication in downlink and uplink directions. For example, as shown in FIG. 4, a full-duplex transmission time interval may include one or more downlink frequency regions (or sub-bands) and one or more uplink frequency regions (or sub-bands) that are separated by a guard band. Accordingly, an SB-FD configuration may divide an unpaired frequency band (e.g., one or more component carriers of an unpaired band) into uplink frequency regions, downlink frequency regions, and/or other regions (e.g., guard bands), which may enable a UE with full-duplex capabilities to perform concurrent or simultaneous transmit and receive operations during one or more transmission time intervals that are divided into downlink and uplink sub-bands. Furthermore, as shown in FIG. 4, the SB-FD configuration may include a guard band separation between the downlink and uplink sub-bands to prevent uplink transmission from causing self-interference with respect to downlink reception. In some aspects, the SB-FD configuration may identify bandwidth part configurations corresponding to the uplink frequency regions and the downlink frequency regions. For example, a respective bandwidth part may be configured for each uplink frequency region and each downlink frequency region.

As indicated above, FIG. 4 is provided as one or more examples. Other examples may differ from what is described with regard to FIG. 4.

Figure 5:
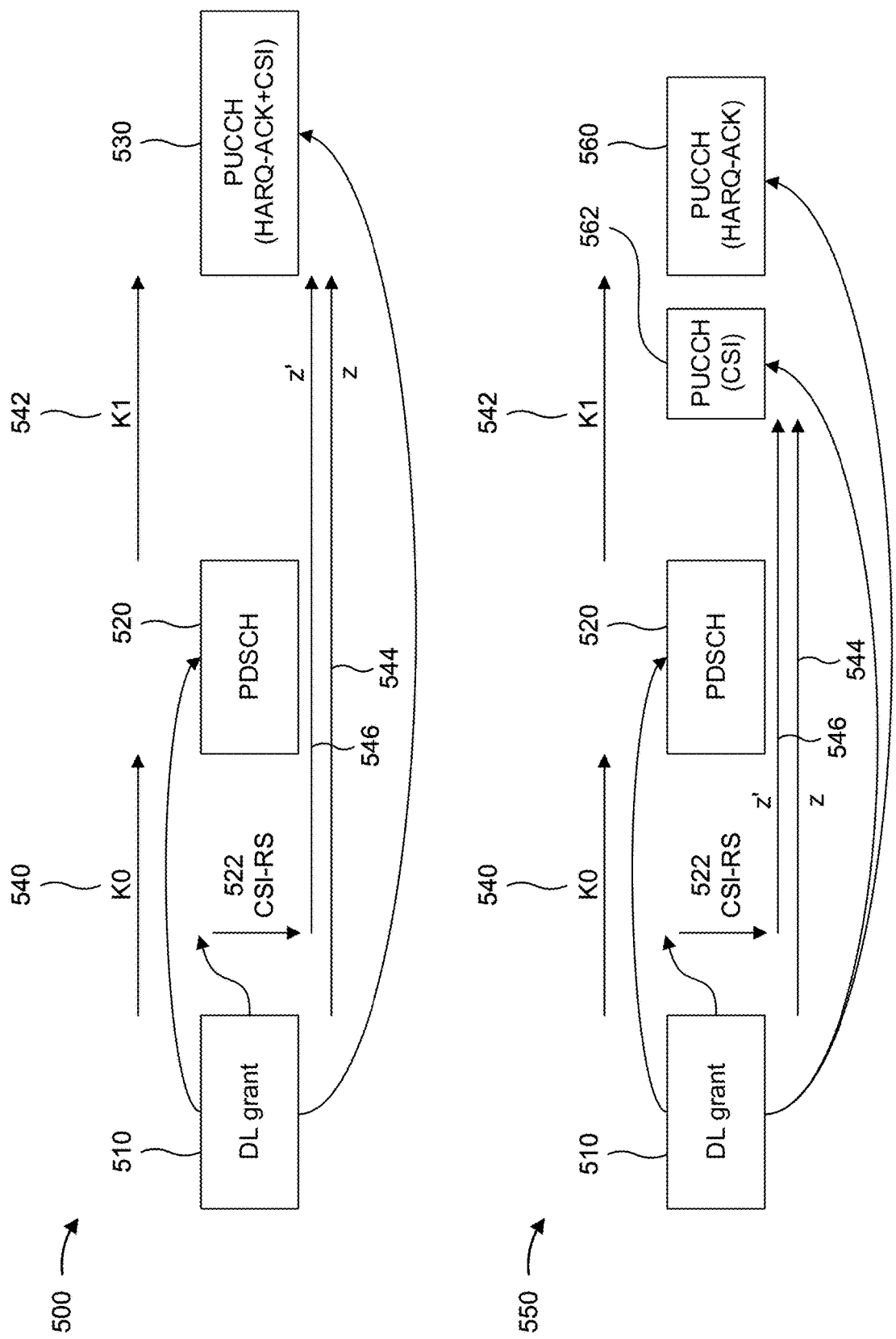
FIG. 5 is a diagram illustrating an example of a downlink grant triggering an aperiodic channel state information report on a physical uplink control channel, in accordance with the present disclosure.

FIG. 5 is a diagram illustrating an example 500 of a downlink grant triggering an aperiodic channel state information (CSI) report on a PUCCH, in accordance with the present disclosure. For example, in a wireless network, a CSI report that a UE transmits to a base station typically includes periodic CSI feedback transmitted in a PUCCH, semi-persistent CSI feedback transmitted in a PUCCH or a PUSCH, or aperiodic CSI feedback that is transmitted in a PUSCH and triggered by an uplink grant. Consequently, in cases where aperiodic CSI feedback is limited to transmission in a PUSCH following an uplink grant, a UE may experience increased latency and reduced reliability (e.g., because the aperiodic CSI feedback cannot be transmitted until a PUSCH resource is available, which may increase latency, and the base station may be unaware of a need to adjust downlink transmission parameters until the aperiodic CSI feedback is received, which may reduce reliability). Accordingly, in some wireless networks, a UE may be configured to transmit an aperiodic CSI report to a base station in a PUCCH that is triggered by a downlink grant, where the CSI feedback carried in the aperiodic CSI report may inform the base station about channel quality with respect to a PDSCH transmission scheduled by the downlink grant.

For example, FIG. 5 illustrates a first technique 500 in which a downlink grant 510 (which may be carried in downlink control information (DCI)) schedules a PDSCH 520 and triggers an aperiodic CSI report based on one or more reference signal transmissions to enable downlink channel estimation. For example, in addition to scheduling the PDSCH 520, the downlink grant 510 may trigger a CSI reference signal (CSI-RS) 522 prior to the PDSCH 520, such that a UE may use the CSI-RS 522 for downlink channel estimation by obtaining one or more CSI measurements that relate to downlink channel conditions. Additionally, or alternatively, the downlink grant 510 may trigger aperiodic CSI reporting based on a decoding of the PDSCH 520, in which case the UE may use a DMRS included in the PDSCH 520 to perform downlink channel estimation and obtain the CSI measurements that relate to downlink channel conditions. As further shown in FIG. 5, the downlink grant 510 may trigger an aperiodic CSI report that includes CSI measurements associated with the CSI-RS 522 and/or the DMRS included in the PDSCH 520 (e.g., to reduce a latency or increase reliability of CSI reporting). For example, the downlink grant 510 may include a CSI trigger field that includes one or more bits to indicate a CSI trigger state that includes a CSI report setting and a CSI-RS resource setting.

In the first technique 500 shown in FIG. 5, the downlink grant 510 may trigger the aperiodic CSI report and hybrid automatic repeat request acknowledgement (HARQ-ACK) feedback for the PDSCH 520 (e.g., to indicate whether the UE successfully received and/or decoded the PDSCH 520) in a common PUCCH resource 530. Accordingly, the downlink grant 510 may indicate various parameters to indicate resource allocations in a time domain for various transmissions that are scheduled or triggered by the downlink grant 510. For example, as shown, the downlink grant 510 may indicate a K0 parameter 540 that defines an offset between a downlink slot in which a PDCCH carrying the downlink grant 510 is received and a downlink slot in which the PDSCH 520 is scheduled. As further shown, the downlink grant 510 may indicate a K1 parameter 542 that defines an offset between the downlink slot in which the PDSCH 520 is scheduled and the common PUCCH resource 530 to carry the HARQ-ACK feedback for the PDSCH 520 and the aperiodic CSI report that is based on measurements of the CSI-RS 522 and/or the decoding of the PDSCH 520.

Furthermore, in some aspects, the downlink grant 510 may indicate one or more timing parameters associated with the aperiodic CSI report. For example, in some aspects, the downlink grant 510 may indicate a z parameter 544 that defines an offset between the downlink slot in which the downlink grant 510 is received and the common PUCCH resource 530 carrying the aperiodic CSI report. Additionally, or alternatively, the downlink grant 510 may indicate a z' parameter 546 that defines an offset between the CSI-RS 522 and the common PUCCH resource 530 configured to carry the aperiodic CSI report. In this way, the UE may determine a time domain resource allocation that indicates the respective locations in time for the PDSCH 520 scheduled by the downlink grant 510, the CSI-RS 522 triggered by the downlink grant 510 (if applicable), the PUCCH resource 530 to carry the HARQ-ACK feedback, and/or the PUCCH resource 530 to carry the aperiodic CSI report, among other examples.

Additionally, or alternatively, in a second technique 550 shown in FIG. 5, the downlink grant 510 may trigger the aperiodic CSI report and HARQ-ACK feedback for the PDSCH 520 in separate PUCCH resources 560, 562. In such cases, as shown, the downlink grant 510 may indicate the z parameter 544 to define an offset between the downlink slot in which the PDCCH carrying the downlink grant 510 is received and the PUCCH resource 562 to carry the aperiodic CSI report. Additionally, or alternatively, if the aperiodic CSI report is to include CSI feedback based on a CSI-RS 522, the downlink grant 510 may indicate a z' parameter 546 to define an offset between the CSI-RS 522 triggered by the downlink grant 510 and the PUCCH resource 562 to carry the aperiodic CSI report. In this way, the UE may determine, in the time domain, the respective locations of the PDSCH 520, the CSI-RS 522 triggered by the downlink grant 510 (if applicable), and the PUCCH resources 560, 562 that are allocated to carry the HARQ-ACK feedback and the aperiodic CSI report, among other examples.

In some aspects, as described herein, a wireless network may support using the downlink grant 510 to trigger transmission of an aperiodic CSI report in a PUCCH resource 530 or 562 in order to increase reliability and/or reduce latency based on a decoding result associated with the PDSCH 520. For example, the downlink grant 510 may trigger aperiodic CSI reporting to satisfy ultra-reliable low-latency communication (URLLC) requirements, which include stringent reliability requirements (e.g., a block error rate (BLER) no worse than 1e-5) with a strict end-to-end latency (e.g., 1 millisecond (ms) or less). For example, in a URLLC HARQ procedure (sometimes referred to as Turbo-HARQ), a base station may use periodic CSI reports to select an initial MCS to satisfy a target BLER of 1e-1 for an initial (new) transmission of a PDSCH 520 to a UE, and the base station may use an aperiodic CSI report that the UE transmits along with HARQ feedback (e.g., ACK or negative acknowledgement (NACK) feedback) to select an MCS to satisfy a target BLER of 1e-4 such that the initial transmission of the PDSCH 520 and a first retransmission of the PDSCH 520 satisfy the target BLER of 1e-5. In such cases, the UE may receive the initial transmission of the PDSCH 520, which the base station transmits using a scheduled MCS indicated in the downlink grant 510, and the UE may attempt to decode the initial transmission of the PDSCH 520. In cases where the decoding is unsuccessful, the UE may determine an MCS that is needed to decode the PDSCH 520. For example, the UE may calculate an accumulated capacity based at least in part on a signal-to-interference-plus-noise ratio (SINR) of the PDSCH 520, which may be mapped to an MCS needed to decode the PDSCH 520 based on a difference between the accumulated capacity and a target capacity of the PDSCH 520. The UE may then transmit uplink control information (UCI) that indicates NACK feedback for the communication (e.g., due to unsuccessful decoding of the PDSCH 520) and aperiodic CSI feedback that indicates the MCS needed to decode the PDSCH 520. For example, in cases where the HARQ feedback includes a NACK based on an unsuccessful decoding of the PDSCH 520, the CSI feedback may indicate that the MCS is to be lowered by a first delta such that the retransmission of the PDSCH 520 may include a larger number of RBs to satisfy a residual BLER. Alternatively, in cases where the HARQ feedback includes an ACK based on a successful decoding, the CSI feedback may indicate that the MCS is to be increased by a second delta.

As described herein, enabling full-duplex operation in unpaired spectrum may increase spectral efficiency, enable high data rates, and/or reduce latency (e.g., to support URLLC control channels). For example, enabling full-duplex operation in unpaired spectrum may reduce latency by providing more uplink transmission opportunities and/or may improve spectral efficiency, throughput, or resource utilization by simultaneously utilizing time resources for downlink and uplink communication. However, scheduling simultaneous downlink and uplink transmissions in unpaired spectrum is associated with various challenges. For example, in some cases, half-duplex operation (e.g., downlink-only or uplink-only) may offer better performance than full-duplex operation (e.g., when full-duplex communication may cause self-interference or cross-link interference and/or or a UE needs to perform a half-duplex operation with a high data rate). Accordingly, because half-duplex communication and full-duplex communication may be associated with different channel qualities (e.g., due to self-interference or cross-link interference), some aspects described herein relate to reporting the difference between half-duplex and full-duplex channel qualities using one or more low-density parity-check (LDPC) decoder parameters. For example, in some aspects, the one or more LDPC decoder parameters may include a number of LDPC decoder iterations needed to decode a PDSCH transmission and/or a number of bit flips that occurred during a process of decoding the PDSCH transmission using the LDPC decoder. In this way, the LDPC decoder parameters may indicate a half-duplex channel quality, a full-duplex channel quality, and/or a difference between the half-duplex channel quality and the full-duplex channel quality, which the base station can then use to adapt an MCS and/or other transmission parameters for subsequent transmissions.

As indicated above, FIG. 5 is provided as one or more examples. Other examples may differ from what is described with regard to FIG. 5.

Figure 6:
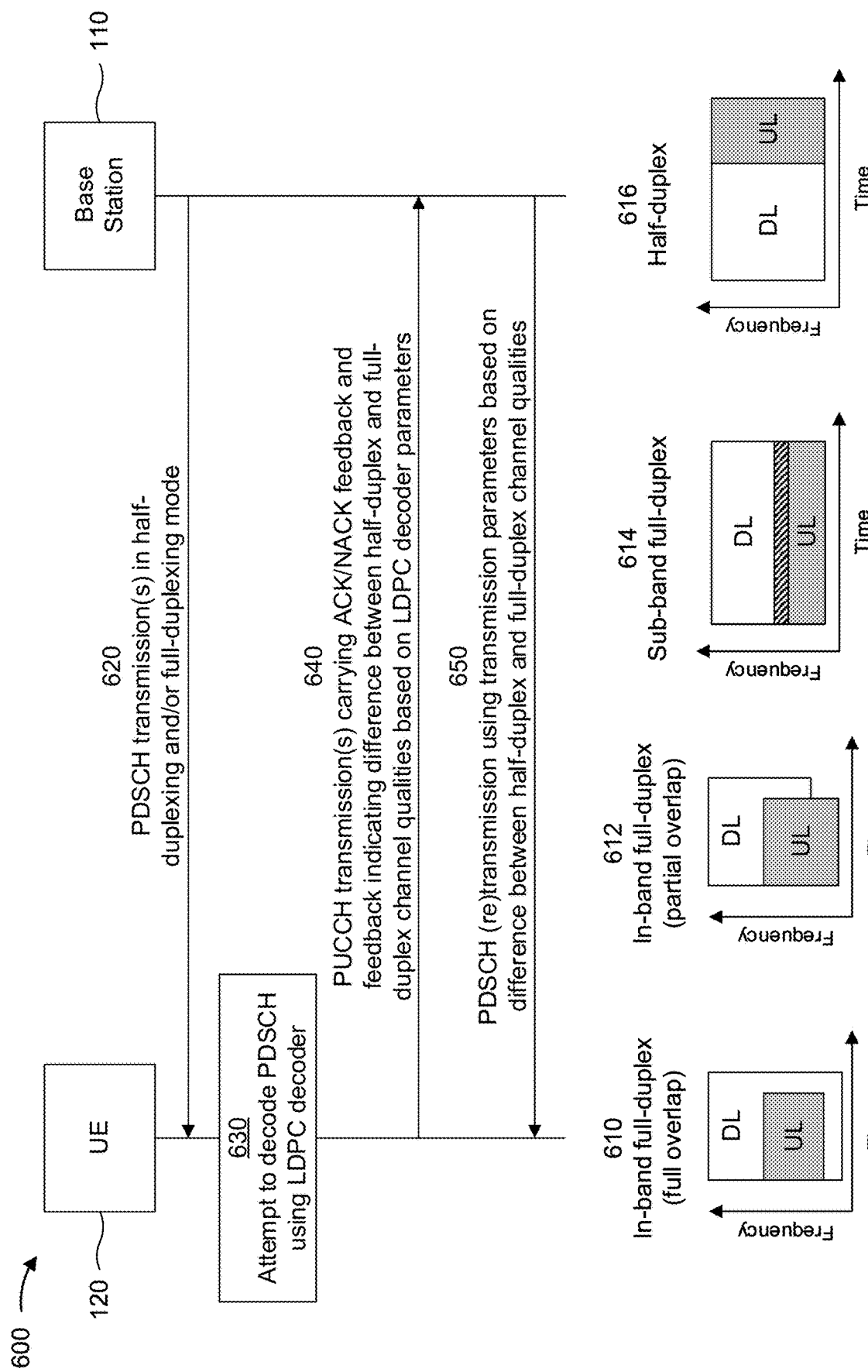
FIG. 6 is a diagram illustrating an example associated with reporting a difference between half-duplex and full-duplex channel qualities via low-density parity-check (LDPC) decoder parameters, in accordance with the present disclosure.

FIG. 6 is a diagram illustrating an example 600 associated with reporting a difference between half-duplex and full-duplex channel qualities via LDPC decoder parameters, in accordance with the present disclosure. As shown in FIG. 6, a UE 120 may communicate with a base station 110 in a wireless network (e.g., wireless network 100). In some aspects, the UE 120 may communicate with the base station 110 in a full-duplex mode and/or a half-duplex mode (e.g., via one or more TRPs).

For example, as shown by reference number 610, full-duplex communication may be enabled in an in-band full-duplex (IBFD) mode where uplink communication occurs on time and frequency resources that fully overlap time and frequency resources allocated to downlink communication (e.g., all of the time and frequency resources available for uplink communication are also available for downlink communication). Additionally, or alternatively, as shown by reference number 612, full-duplex communication may be enabled in an IBFD mode where time and frequency resources available for uplink communication partially overlap with time and frequency resources available for downlink communication (e.g., some time and frequency resources available for uplink communication are also available for downlink communication and some time and frequency resources available for uplink communication are uplink-only). Additionally, or alternatively, as shown by reference number 614, full-duplex communication may be enabled in an SBFD mode, where simultaneous transmission and reception occurs in different frequency resources, which include separate downlink and uplink frequency resources that are separated by a guard band on the same carrier. Additionally, or alternatively, as shown by reference number 616, the UE 120 and the base station 110 may communicate in a half-duplex mode, where communication in each transmission time interval is downlink-only or uplink-only.

As shown by reference number 620, the base station 110 may transmit, and the UE 120 may receive, a PDSCH transmission in a half-duplexing mode and/or a full-duplexing mode. For example, in a half-duplexing mode, the PDSCH transmission may be carried on downlink-only time and frequency resources (e.g., the UE 120 does not perform any uplink transmission that is concurrent or simultaneous with reception of the PDSCH transmission). Alternatively, in a full-duplexing mode, the PDSCH transmission may be carried on downlink time and frequency resources that fully or partially overlap with uplink time and frequency resources. Additionally, or alternatively, in some cases, the PDSCH transmission may span both half-duplex operation and full-duplex operation (e.g., the PDSCH transmission may span one or more downlink-only symbols and one or more full-duplex symbols). Although some aspects are described in terms of a PDSCH transmission for ease of explanation, it is understood that the PDSCH transmission may comprise one or more PDSCH transmissions.

As shown by reference number 630, the UE 120 may attempt to decode the PDSCH transmission using an LDPC decoder. For example, as described herein, the UE 120 may use the LDPC decoder in order to control or correct errors that may occur when the PDSCH transmission travels over an unreliable or noisy communication channel. For example, poor channel quality may cause one or more bit flips in the PDSCH transmission, where a zero (0) is stored in a location where a one (1) is expected to be stored and/or a one (1) is stored in a location where a zero (0) is expected to be stored.

Accordingly, the LDPC decoder may support error correction code (ECC) techniques where additional (e.g., parity) bits are stored and used to determine whether there is an error in the PDSCH transmission. For example, the LDPC decoder may be configured to construct a relationship between decoded data bits called a sparse parity-check matrix that is then used to construct LDPC codes (e.g., parity codes). Each parity check is generally treated as an independent single parity check (SPC) code, which may be decoded using a soft-in-soft-out technique. For example, the LDPC decoder may make a soft decision at each parity check, which is then cross-checked with other SPC codes. The SPC code is then decoded again using soft updates from the cross-checking, which results in an iterative PDSCH decoding process that may complete when a valid codeword is achieved or PDSCH decoding is exhausted (e.g., there are no other SPCs). Generally, when decoding is exhausted, a PDSCH decoding error is indicated and other error correction techniques may be employed.

Accordingly, in some aspects, one or more parameters associated with the LDPC decoder can be used to determine the channel quality associated with the duplexing mode used for the PDSCH transmission. For example, a larger number of LDPC decoder iterations may indicate a poorer channel quality, and a larger number of bit flips during the PDSCH decoding process of the LDPC decoder may indicate a larger error probability. In some aspects, the UE 120 may therefore transmit feedback to the base station 110 that relates one or more LDPC decoder parameters with one or more duplexing modes in order to indicate a half-duplex channel quality, a full-duplex channel quality, and/or a difference between the half-duplex channel quality and the full-duplex channel quality.

For example, as shown by reference number 640, the UE 120 may transmit, and the base station 110 may receive, one or more PUCCH transmissions that include ACK/NACK feedback for the PDSCH transmission and feedback that indicates the difference between half-duplex and full-duplex channel qualities based on one or more LDPC decoder parameters (e.g., according to a Turbo-HARQ scheme). For example, as described above with reference to FIG. 5, the UE 120 may transmit ACK/NACK feedback for the PDSCH transmission and feedback that relates to channel quality using a common PUCCH resource, or the UE 120 may transmit the ACK/NACK feedback for the PDSCH transmission and the feedback that relates to channel quality using separate PUCCH resources. Accordingly, as described herein, the feedback that the UE 120 transmits to the base station 110 may generally include the one or more LDPC decoder parameters to indicate a half-duplex channel quality, a full-duplex channel quality, and/or a difference between the half-duplex and full-duplex channel qualities in addition to HARQ-ACK feedback that indicates whether the LDPC decoder was able to successfully decode the PDSCH transmission.

For example, in some aspects, the feedback that the UE 120 transmits to the base station 110 may include a number of LDPC decoder iterations that were performed in order to decode the PDSCH transmission and/or a number of LDPC decoder iterations that were performed before the determining that the attempt to decode the PDSCH transmission resulted in failure. Furthermore, in some aspects, the feedback that the UE 120 transmits to the base station 110 may indicate whether the PDSCH transmission was received in a half-duplexing mode, a full-duplexing mode, or a combination thereof. Accordingly, the UE 120 may generally be configured to report the number of LDPC decoder iterations that were performed for one or more PDSCH transmissions from the base station 110 in addition to information that indicates the duplexing mode associated with the one or more PDSCH transmissions. Additionally, or alternatively, the feedback transmitted by the UE 120 may indicate a difference between the number of LDPC decoder iterations associated with decoding one or more PDSCH transmissions in a half-duplexing mode and the number of LDPC decoder iterations associated with decoding one or more PDSCH transmissions in a full-duplexing mode. For example, the UE 120 may report the difference between the average number of LDPC decoder iterations performed to decode one or more PDSCH transmissions in the half-duplex mode and the average number of LDPC decoder iterations performed to decode one or more PDSCH transmissions in the full-duplex mode (e.g., during a communication session and/or within a time window, among other examples). Furthermore, in some cases, reception of the PDSCH transmission(s) may span half-duplex and full-duplex operation (e.g., the PDSCH transmission(s) may carry one or more transport blocks (TBs) with some code blocks (CBs) and/or code block groups (CBGs) carried on half-duplex resources and some CBs and/or CBGs carried on full-duplex resources). In such cases, the feedback transmitted from the UE 120 to the base station 110 may indicate the number of LDPC decoder iterations for the one or more CBGs that span and/or overlap with full-duplex resources, the number of LDPC decoder iterations for the one or more CBGs that span and/or overlap with half-duplex resources, the average number of LDPC decoder iterations over all of the CBs in the TB(s) of the PDSCH transmission(s), and/or the number of LDPC decoder iterations for each individual CB.

Additionally, or alternatively, the feedback that the UE 120 transmits to the base station 110 may include information related to one or more bit flips that occurred during a decoding process of the LDPC decoder. For example, in cases where a PDSCH transmission includes a bit that is received in error at the UE 120, the bit that is received in error may have a value of one (1) that should be a zero (0) or vice versa. In such cases, one or more parity checks performed by the LDPC decoder may result in a failure, which may result in the LDPC decoder flipping the bit. For example, in cases where a bit receives more negative votes than positive votes from one or more parity check equations, the LDPC decoder may flip the bit. Accordingly, the number of bit flips that occur when using the LDPC decoder to decode one or more PDSCH transmissions may indicate a probability of error associated with the PDSCH transmission(s), whereby the number of bit flips may indicate the channel quality of half-duplex and/or full-duplex operation (e.g., a smaller number of bit flips may generally correlate to better channel quality and vice versa).

Accordingly, in some aspects, the feedback that the UE 120 provides to the base station 110 may include the number of bit flips that occurred when decoding one or more PDSCH transmissions that were transmitted in a half-duplex mode and/or the number of bit flips that occurred when decoding one or more PDSCH transmissions that were transmitted in a full-duplex mode. Additionally, or alternatively, the feedback transmitted by the UE 120 may indicate a difference between the number of bit flips that occurred when decoding one or more PDSCH transmissions in a half-duplexing mode and/or the number of bit flips that occurred during decoding one or more PDSCH transmissions in a full-duplexing mode. For example, the UE 120 may report the difference between the average number of bit flips during a process of decoding the PDSCH transmission(s) in half-duplex and full-duplex modes (e.g., during a communication session and/or within a time window, among other examples). Additionally, or alternatively, in cases where one or more PDSCH transmissions span half-duplex and full-duplex operation, the feedback transmitted from the UE 120 to the base station 110 may indicate the number of bit flips for the one or more CBGs that span and/or overlap with full-duplex resources, the number of bit flips for the one or more CBGs that span and/or overlap with half-duplex resources, the average number of bit flips over all of the CBs in the TB(s) of the PDSCH transmission(s), and/or the number of bit flips for each individual CB, among other examples.

As further shown in FIG. 6, and by reference number 650, the base station 110 may transmit, and the UE 120 may receive, one or more subsequent PDSCH transmissions using one or more transmission parameters that are based on the one or more LDPC decoder parameters reported by the UE 120. For example, as described herein, the LDPC decoder parameters reported by the UE 120 (e.g., LDPC decoder iterations and/or bit flips associated with decoding one or more PDSCH transmissions, CBGs, and/or CBs carried on half-duplex and/or full-duplex resources) may indicate a half-duplex channel quality, a full-duplex channel quality, and/or a difference between the half-duplex and full-duplex channel qualities. Accordingly, the base station 110 may use the one or more LDPC decoder parameters to select an appropriate duplexing mode for a subsequent PDSCH transmission, which may be a retransmission of a previous PDSCH transmission or an initial PDSCH transmission carrying a new TB. For example, the base station 110 may use the one or more LDPC decoder parameters to determine whether to transmit the subsequent PDSCH transmission in a half-duplex or full-duplex mode and/or may select one or more transmission parameters to improve performance for the selected duplexing mode (e.g., selecting an optimal MCS, number of layers, power level, or other suitable transmission parameters for transmitting the subsequent PDSCH transmission in a half-duplexing mode and/or a full-duplexing mode).

As indicated above, FIG. 6 is provided as an example. Other examples may differ from what is described with regard to FIG. 6.

Figure 7:
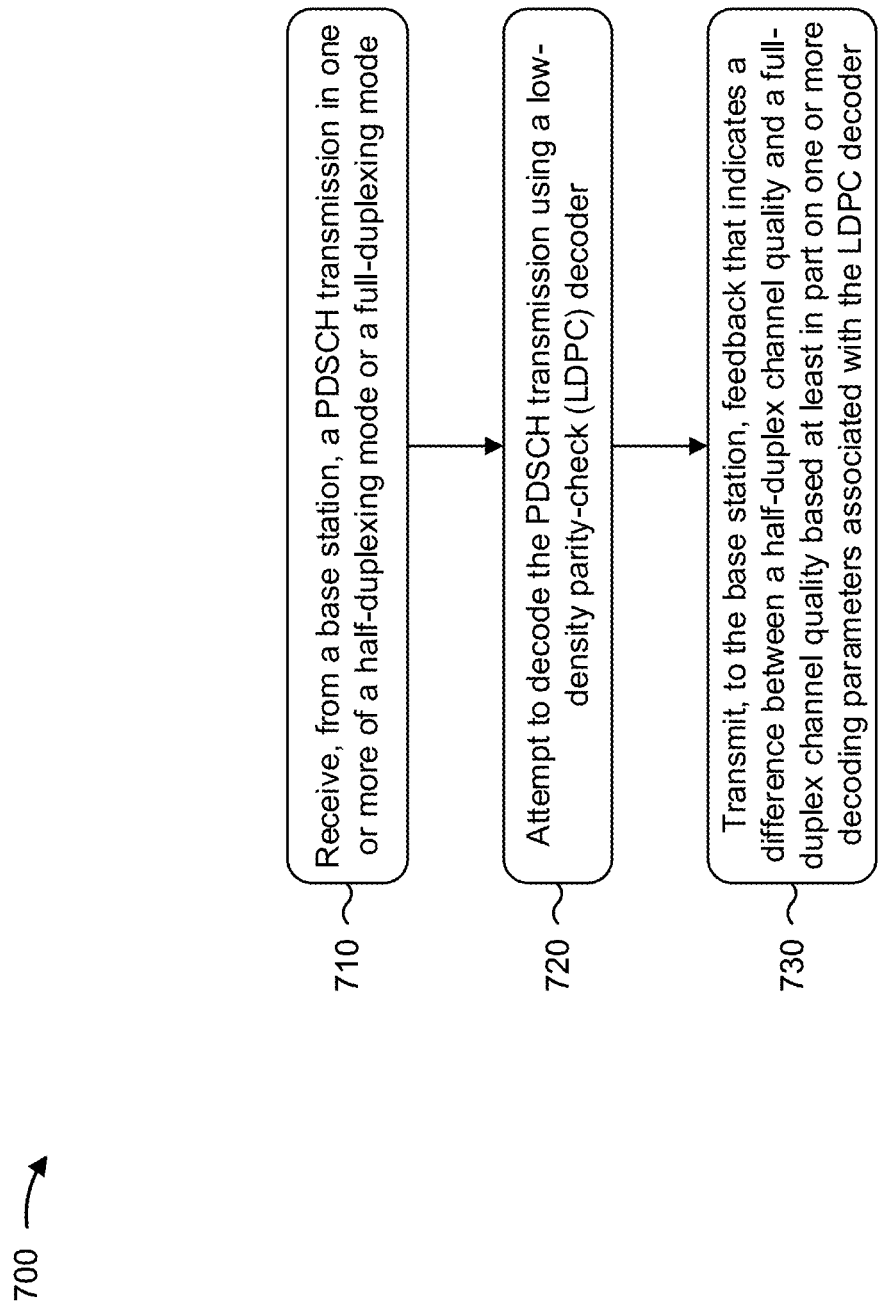
FIGS. 7-8 are diagrams illustrating example processes associated with reporting a difference between half-duplex and full-duplex channel qualities via LDPC decoder parameters, in accordance with the present disclosure.

FIG. 7 is a diagram illustrating an example process 700 performed, for example, by a UE, in accordance with the present disclosure. Example process 700 is an example where the UE (e.g., UE 120) performs operations associated with reporting a difference between half-duplex and full-duplex channel qualities via LDPC decoder parameters.

As shown in FIG. 7, in some aspects, process 700 may include receiving, from a base station, a PDSCH transmission in one or more of a half-duplexing mode or a full-duplexing mode (block 710). For example, the UE (e.g., using communication manager 140 and/or reception component 902, depicted in FIG. 9) may receive, from a base station, a PDSCH transmission in one or more of a half-duplexing mode or a full-duplexing mode, as described above, for example, with reference to FIG. 6.

As further shown in FIG. 7, in some aspects, process 700 may include attempting to decode the PDSCH transmission using an LDPC decoder (block 720). For example, the UE (e.g., using communication manager 140 and/or decoding component 908, depicted in FIG. 9) may attempt to decode the PDSCH transmission using an LDPC decoder, as described above, for example, with reference to FIG. 6.

As further shown in FIG. 7, in some aspects, process 700 may include transmitting, to the base station, feedback that indicates a difference between a half-duplex channel quality and a full-duplex channel quality based at least in part on one or more decoding parameters associated with the LDPC decoder (block 730). For example, the UE (e.g., using communication manager 140 and/or transmission component 904, depicted in FIG. 9) may transmit, to the base station, feedback that indicates a difference between a half-duplex channel quality and a full-duplex channel quality based at least in part on one or more decoding parameters associated with the LDPC decoder, as described above, for example, with reference to FIG. 6.

Process 700 may include additional aspects, such as any single aspect or any combination of aspects described below and/or in connection with one or more other processes described elsewhere herein.

In a first aspect, the one or more decoding parameters include a number of LDPC decoder iterations performed to decode the PDSCH transmission and information that indicates whether the PDSCH transmission was received in the half-duplexing mode or the full-duplexing mode.

In a second aspect, alone or in combination with the first aspect, the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

In a third aspect, alone or in combination with one or more of the first and second aspects, the one or more decoding parameters include a number of LDPC decoder iterations performed to decode one or more CBGs in the PDSCH transmission that were received in the half-duplexing mode and a number of LDPC decoder iterations performed to decode one or more CBGs in the PDSCH transmission that were received in the full-duplexing mode.

In a fourth aspect, alone or in combination with one or more of the first through third aspects, the one or more decoding parameters include an average number of LDPC decoder iterations performed to decode one or more CBs in the PDSCH transmission that were received in the half-duplexing mode and an average number of LDPC decoder iterations performed to decode one or more CBs in the PDSCH transmission that were received in the full-duplexing mode.

In a fifth aspect, alone or in combination with one or more of the first through fourth aspects, the one or more decoding parameters include a number of bit flips that occurred while using the LDPC decoder to decode the PDSCH transmission and information that indicates whether the PDSCH transmission was received in the half-duplexing mode or the full-duplexing mode.

In a sixth aspect, alone or in combination with one or more of the first through fifth aspects, the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

In a seventh aspect, alone or in combination with one or more of the first through sixth aspects, the one or more decoding parameters include a number of bit flips that occurred while using the LDPC decoder to decode one or more CBGs in the PDSCH transmission in the half-duplexing mode and a number of bit flips that occurred while using the LDPC decoder to decode one or more CBGs in the PDSCH transmission in the full-duplexing mode.

In an eighth aspect, alone or in combination with one or more of the first through seventh aspects, the one or more decoding parameters include an average number of bit flips that occurred while using the LDPC decoder to decode one or more CBs in the PDSCH transmission in the half-duplexing mode and an average number of bit flips that occurred while using the LDPC decoder to decode one or more CBs in the PDSCH transmission in the full-duplexing mode.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
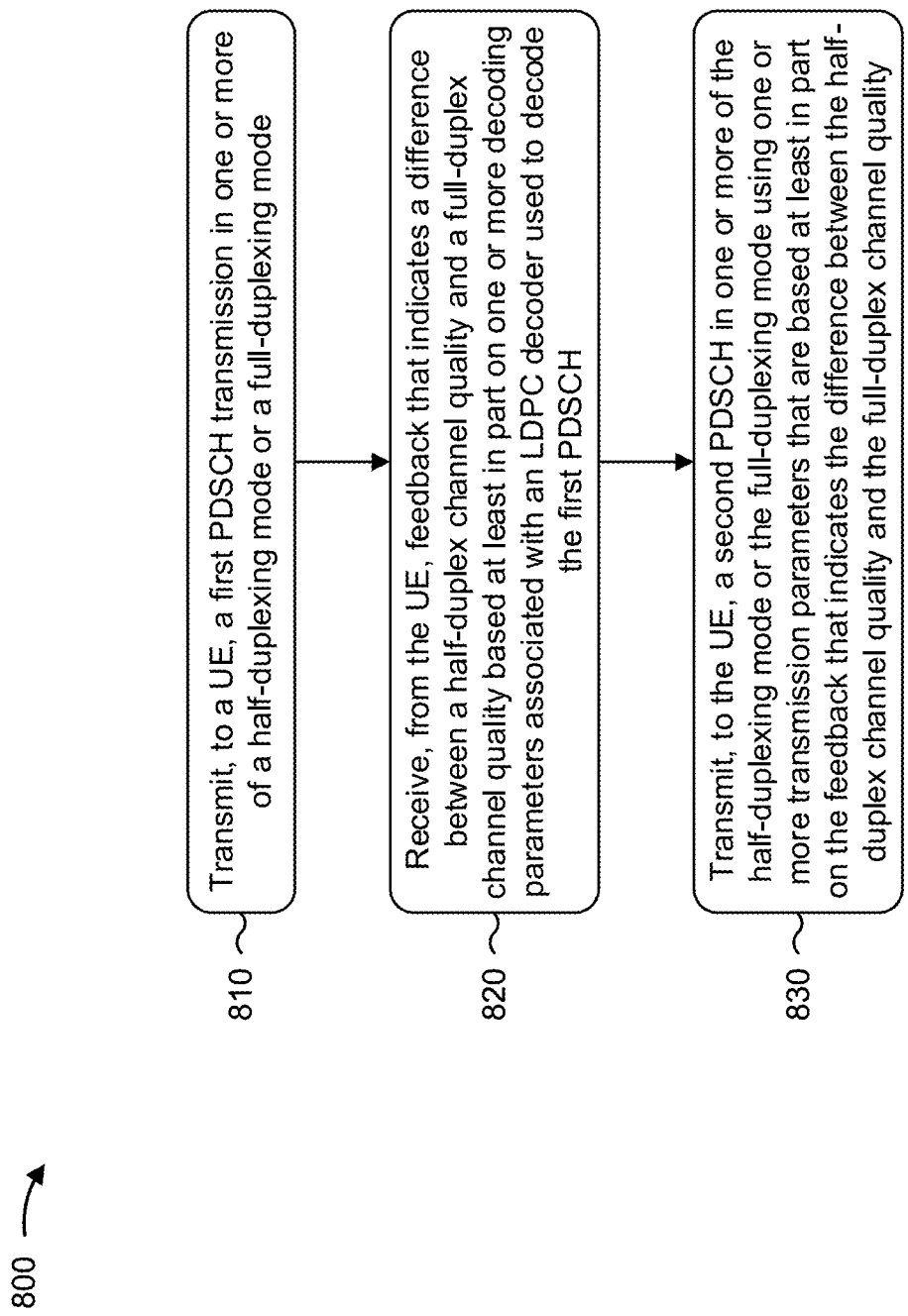

FIG. 8 is a diagram illustrating an example process 800 performed, for example, by a base station, in accordance with the present disclosure. Example process 800 is an example where the base station (e.g., base station 110) performs operations associated with reporting a difference between half-duplex and full-duplex channel qualities via LDPC decoder parameters.

As shown in FIG. 8, in some aspects, process 800 may include transmitting, to a UE, a first PDSCH transmission in one or more of a half-duplexing mode or a full-duplexing mode (block 810). For example, the base station (e.g., using communication manager 150 and/or transmission component 1004, depicted in FIG. 10) may transmit, to a UE, a first PDSCH transmission in one or more of a half-duplexing mode or a full-duplexing mode, as described above, for example, with reference to FIG. 6.

As further shown in FIG. 8, in some aspects, process 800 may include receiving, from the UE, feedback that indicates a difference between a half-duplex channel quality and a full-duplex channel quality based at least in part on one or more decoding parameters associated with an LDPC decoder used to decode the first PDSCH (block 820). For example, the base station (e.g., using communication manager 150 and/or reception component 1002, depicted in FIG. 10) may receive, from the UE, feedback that indicates a difference between a half-duplex channel quality and a full-duplex channel quality based at least in part on one or more decoding parameters associated with an LDPC decoder used to decode the first PDSCH, as described above, for example, with reference to FIG. 6.

As further shown in FIG. 8, in some aspects, process 800 may include transmitting, to the UE, a second PDSCH in one or more of the half-duplexing mode or the full-duplexing mode using one or more transmission parameters that are based at least in part on the feedback that indicates the difference between the half-duplex channel quality and the full-duplex channel quality (block 830). For example, the base station (e.g., using communication manager 150 and/or transmission component 1004, depicted in FIG. 10) may transmit, to the UE, a second PDSCH in one or more of the half-duplexing mode or the full-duplexing mode using one or more transmission parameters that are based at least in part on the feedback that indicates the difference between the half-duplex channel quality and the full-duplex channel quality, as described above, for example, with reference to FIG. 6.

Process 800 may include additional aspects, such as any single aspect or any combination of aspects described below and/or in connection with one or more other processes described elsewhere herein.

In a first aspect, the one or more decoding parameters include a number of LDPC decoder iterations performed to decode the PDSCH transmission and information that indicates whether the PDSCH transmission was received in the half-duplexing mode or the full-duplexing mode.

In a second aspect, alone or in combination with the first aspect, the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

In a third aspect, alone or in combination with one or more of the first and second aspects, the one or more decoding parameters include a number of LDPC decoder iterations performed to decode one or more CBGs in the PDSCH transmission that were received in the half-duplexing mode and a number of LDPC decoder iterations performed to decode one or more CBGs in the PDSCH transmission that were received in the full-duplexing mode.

In a fourth aspect, alone or in combination with one or more of the first through third aspects, the one or more decoding parameters include an average number of LDPC decoder iterations performed to decode one or more CBs in the PDSCH transmission that were received in the half-duplexing mode and an average number of LDPC decoder iterations performed to decode one or more CBs in the PDSCH transmission that were received in the full-duplexing mode.

In a fifth aspect, alone or in combination with one or more of the first through fourth aspects, the one or more decoding parameters include a number of bit flips that occurred while using the LDPC decoder to decode the PDSCH transmission and information that indicates whether the PDSCH transmission was received in the half-duplexing mode or the full-duplexing mode.

In a sixth aspect, alone or in combination with one or more of the first through fifth aspects, the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

In a seventh aspect, alone or in combination with one or more of the first through sixth aspects, the one or more decoding parameters include a number of bit flips that occurred while using the LDPC decoder to decode one or more CBGs in the PDSCH transmission in the half-duplexing mode and a number of bit flips that occurred while using the LDPC decoder to decode one or more CBGs in the PDSCH transmission in the full-duplexing mode.

In an eighth aspect, alone or in combination with one or more of the first through seventh aspects, the one or more decoding parameters include an average number of bit flips that occurred while using the LDPC decoder to decode one or more CBs in the PDSCH transmission in the half-duplexing mode and an average number of bit flips that occurred while using the LDPC decoder to decode one or more CBs in the PDSCH transmission in the full-duplexing mode.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
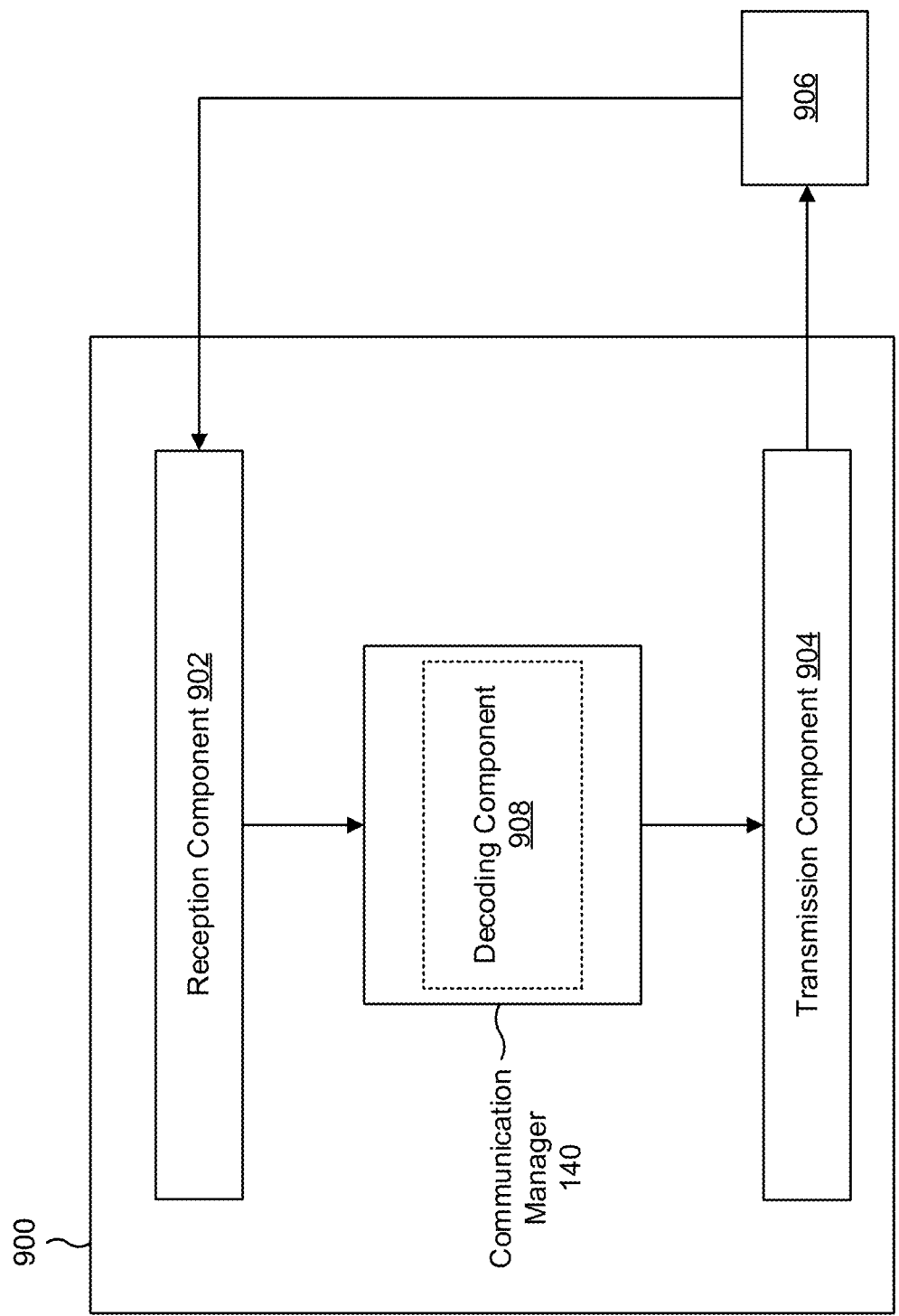
FIGS. 9-10 are diagrams of example apparatuses for wireless communication, in accordance with the present disclosure.

FIG. 9 is a diagram of an example apparatus 900 for wireless communication. The apparatus 900 may be a UE, or a UE may include the apparatus 900. In some aspects, the apparatus 900 includes a reception component 902 and a transmission component 904, which may be in communication with one another (for example, via one or more buses and/or one or more other components). As shown, the apparatus 900 may communicate with another apparatus 906 (such as a UE, a base station, or another wireless communication device) using the reception component 902 and the transmission component 904. As further shown, the apparatus 900 may include the communication manager 140. The communication manager 140 may include a decoding component 908, among other examples.

In some aspects, the apparatus 900 may be configured to perform one or more operations described herein in connection with FIG. 6. Additionally, or alternatively, the apparatus 900 may be configured to perform one or more processes described herein, such as process 700 of FIG. 7. In some aspects, the apparatus 900 and/or one or more components shown in FIG. 9 may include one or more components of the UE described in connection with FIG. 2. Additionally, or alternatively, one or more components shown in FIG. 9 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 902 may receive communications, such as reference signals, control information, data communications, or a combination thereof, from the apparatus 906. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 900. In some aspects, the reception component 902 may include one or more antennas, a modem, a demodulator, a MIMO detector, a receive processor, a controller/processor, a memory, or a combination thereof, of the UE described in connection with FIG. 2.

The transmission component 904 may transmit communications, such as reference signals, control information, data communications, or a combination thereof, to the apparatus 906. In some aspects, one or more other components of the apparatus 900 may generate communications and may provide the generated communications to the transmission component 904 for transmission to the apparatus 906. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 906. In some aspects, the transmission component 904 may include one or more antennas, a modem, a modulator, a transmit MIMO processor, a transmit processor, a controller/processor, a memory, or a combination thereof, of the UE described in connection with FIG. 2. In some aspects, the transmission component 904 may be co-located with the reception component 902 in a transceiver.

The reception component 902 may receive, from a base station, a PDSCH transmission in one or more of a half-duplexing mode or a full-duplexing mode. The decoding component 908 may attempt to decode the PDSCH transmission using an LDPC decoder. The transmission component 904 may transmit, to the base station, feedback that indicates a difference between a half-duplex channel quality and a full-duplex channel quality based at least in part on one or more decoding parameters associated with the LDPC decoder.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

Figure 10:
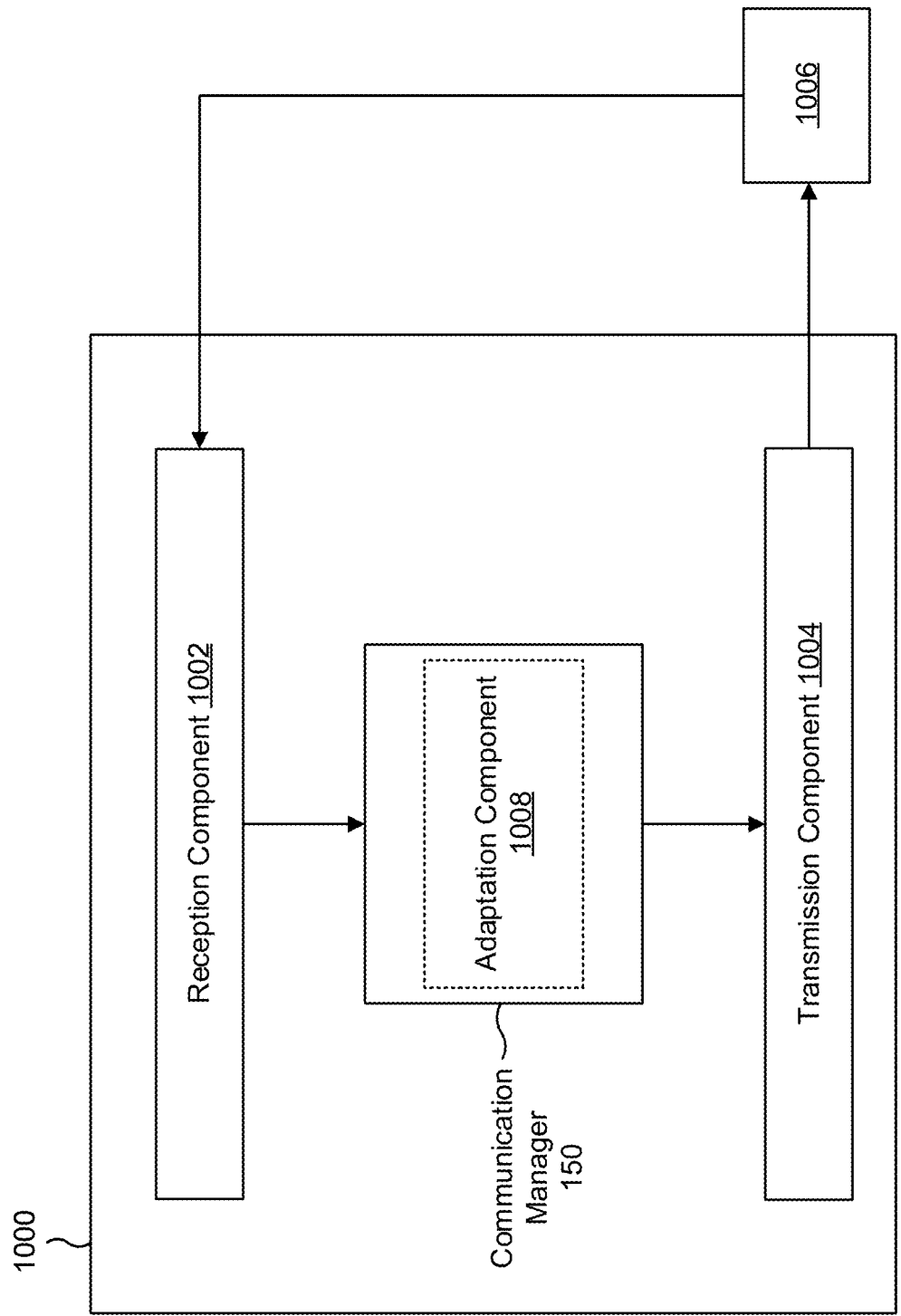

FIG. 10 is a diagram of an example apparatus 1000 for wireless communication. The apparatus 1000 may be a base station, or a base station may include the apparatus 1000. In some aspects, the apparatus 1000 includes a reception component 1002 and a transmission component 1004, which may be in communication with one another (for example, via one or more buses and/or one or more other components). As shown, the apparatus 1000 may communicate with another apparatus 1006 (such as a UE, a base station, or another wireless communication device) using the reception component 1002 and the transmission component 1004. As further shown, the apparatus 1000 may include the communication manager 150. The communication manager 150 may include an adaptation component 1008, among other examples.

In some aspects, the apparatus 1000 may be configured to perform one or more operations described herein in connection with FIG. 6. Additionally, or alternatively, the apparatus 1000 may be configured to perform one or more processes described herein, such as process 800 of FIG. 8. In some aspects, the apparatus 1000 and/or one or more components shown in FIG. 10 may include one or more components of the base station described in connection with FIG. 2. Additionally, or alternatively, one or more components shown in FIG. 10 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1002 may receive communications, such as reference signals, control information, data communications, or a combination thereof, from the apparatus 1006. The reception component 1002 may provide received communications to one or more other components of the apparatus 1000. In some aspects, the reception component 1002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1000. In some aspects, the reception component 1002 may include one or more antennas, a modem, a demodulator, a MIMO detector, a receive processor, a controller/processor, a memory, or a combination thereof, of the base station described in connection with FIG. 2.

The transmission component 1004 may transmit communications, such as reference signals, control information, data communications, or a combination thereof, to the apparatus 1006. In some aspects, one or more other components of the apparatus 1000 may generate communications and may provide the generated communications to the transmission component 1004 for transmission to the apparatus 1006. In some aspects, the transmission component 1004 may perform signal processing on the generated communications (such as filtering, amplification, modulation, digital-to-analog conversion, multiplexing, interleaving, mapping, or encoding, among other examples), and may transmit the processed signals to the apparatus 1006. In some aspects, the transmission component 1004 may include one or more antennas, a modem, a modulator, a transmit MIMO processor, a transmit processor, a controller/processor, a memory, or a combination thereof, of the base station described in connection with FIG. 2. In some aspects, the transmission component 1004 may be co-located with the reception component 1002 in a transceiver.

The transmission component 1004 may transmit, to a UE, a first PDSCH transmission in one or more of a half-duplexing mode or a full-duplexing mode. The reception component 1002 may receive, from the UE, feedback that indicates a difference between a half-duplex channel quality and a full-duplex channel quality based at least in part on one or more decoding parameters associated with an LDPC decoder used to decode the first PDSCH. The adaptation component 1008 may determine one or more transmission parameters for a second PDSCH based at least in part on the feedback that indicates the difference between the half-duplex channel quality and the full-duplex channel quality. The transmission component 1004 may transmit, to the UE, the second PDSCH in one or more of the half-duplexing mode or the full-duplexing mode using the one or more transmission parameters that are based at least in part on the feedback that indicates the difference between the half-duplex channel quality and the full-duplex channel quality.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

The following provides an overview of some Aspects of the present disclosure:

Aspect 1: A method of wireless communication performed by a UE, comprising: receiving, from a base station, a PDSCH transmission in one or more of a half-duplexing mode or a full-duplexing mode; attempting to decode the PDSCH transmission using an LDPC decoder; and transmitting, to the base station, feedback that indicates a difference between a half-duplex channel quality and a full-duplex channel quality based at least in part on one or more decoding parameters associated with the LDPC decoder.

Aspect 2: The method of Aspect 1, wherein the one or more decoding parameters include a number of LDPC decoder iterations performed to decode the PDSCH transmission and information that indicates whether the PDSCH transmission was received in the half-duplexing mode or the full-duplexing mode.

Aspect 3: The method of any of Aspects 1-2, wherein the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

Aspect 4: The method of any of Aspects 1-3, wherein the one or more decoding parameters include a number of LDPC decoder iterations performed to decode one or more CBGs in the PDSCH transmission that were received in the half-duplexing mode and a number of LDPC decoder iterations performed to decode one or more CBGs in the PDSCH transmission that were received in the full-duplexing mode.

Aspect 5: The method of any of Aspects 1-4, wherein the one or more decoding parameters include an average number of LDPC decoder iterations performed to decode one or more CBs in the PDSCH transmission that were received in the half-duplexing mode and an average number of LDPC decoder iterations performed to decode one or more CBs in the PDSCH transmission that were received in the full-duplexing mode.

Aspect 6: The method of any of Aspects 1-6, wherein the one or more decoding parameters include a number of bit flips that occurred while using the LDPC decoder to decode the PDSCH transmission and information that indicates whether the PDSCH transmission was received in the half-duplexing mode or the full-duplexing mode.

Aspect 7: The method of any of Aspects 1-7, wherein the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

Aspect 8: The method of any of Aspects 1-8, wherein the one or more decoding parameters include a number of bit flips that occurred while using the LDPC decoder to decode one or more CBGs in the PDSCH transmission in the half-duplexing mode and a number of bit flips that occurred while using the LDPC decoder to decode one or more CBGs in the PDSCH transmission in the full-duplexing mode.

Aspect 9: The method of any of Aspects 1-9, wherein the one or more decoding parameters include an average number of bit flips that occurred while using the LDPC decoder to decode one or more CBs in the PDSCH transmission in the half-duplexing mode and an average number of bit flips that occurred while using the LDPC decoder to decode one or more CBs in the PDSCH transmission in the full-duplexing mode.

Aspect 10: A method of wireless communication performed by a base station, comprising: transmitting, to a UE, a first PDSCH transmission in one or more of a half-duplexing mode or a full-duplexing mode; receiving, from the UE, feedback that indicates a difference between a half-duplex channel quality and a full-duplex channel quality based at least in part on one or more decoding parameters associated with an LDPC decoder used to decode the first PDSCH; and transmitting, to the UE, a second PDSCH in one or more of the half-duplexing mode or the full-duplexing mode using one or more transmission parameters that are based at least in part on the feedback that indicates the difference between the half-duplex channel quality and the full-duplex channel quality.

Aspect 11: The method of Aspect 10, wherein the one or more decoding parameters include a number of LDPC decoder iterations performed to decode the PDSCH transmission and information that indicates whether the PDSCH transmission was received in the half-duplexing mode or the full-duplexing mode.

Aspect 12: The method of any of Aspects 10-11, wherein the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

Aspect 13: The method of any of Aspects 10-12, wherein the one or more decoding parameters include a number of LDPC decoder iterations performed to decode one or more CBGs in the PDSCH transmission that were received in the half-duplexing mode and a number of LDPC decoder iterations performed to decode one or more CBGs in the PDSCH transmission that were received in the full-duplexing mode.

Aspect 14: The method of any of Aspects 10-13, wherein the one or more decoding parameters include an average number of LDPC decoder iterations performed to decode one or more CBs in the PDSCH transmission that were received in the half-duplexing mode and an average number of LDPC decoder iterations performed to decode one or more CBs in the PDSCH transmission that were received in the full-duplexing mode.

Aspect 15: The method of any of Aspects 10-14, wherein the one or more decoding parameters include a number of bit flips that occurred while using the LDPC decoder to decode the PDSCH transmission and information that indicates whether the PDSCH transmission was received in the half-duplexing mode or the full-duplexing mode.

Aspect 16: The method of any of Aspects 10-16, wherein the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

Aspect 17: The method of any of Aspects 10-17, wherein the one or more decoding parameters include a number of bit flips that occurred while using the LDPC decoder to decode one or more CBGs in the PDSCH transmission in the half-duplexing mode and a number of bit flips that occurred while using the LDPC decoder to decode one or more CBGs in the PDSCH transmission in the full-duplexing mode.

Aspect 18: The method of any of Aspects 10-18, wherein the one or more decoding parameters include an average number of bit flips that occurred while using the LDPC decoder to decode one or more CBs in the PDSCH transmission in the half-duplexing mode and an average number of bit flips that occurred while using the LDPC decoder to decode one or more CBs in the PDSCH transmission in the full-duplexing mode.

Aspect 19: An apparatus for wireless communication at a device, comprising a processor; memory coupled with the processor; and instructions stored in the memory and executable by the processor to cause the apparatus to perform the method of one or more of Aspects 1-9.

Aspect 20: A device for wireless communication, comprising a memory and one or more processors coupled to the memory, the one or more processors configured to perform the method of one or more of Aspects 1-9.

Aspect 21: An apparatus for wireless communication, comprising at least one means for performing the method of one or more of Aspects 1-9.

Aspect 22: A non-transitory computer-readable medium storing code for wireless communication, the code comprising instructions executable by a processor to perform the method of one or more of Aspects 1-9.

Aspect 23: A non-transitory computer-readable medium storing a set of instructions for wireless communication, the set of instructions comprising one or more instructions that, when executed by one or more processors of a device, cause the device to perform the method of one or more of Aspects 1-9.

Aspect 24: An apparatus for wireless communication at a device, comprising a processor; memory coupled with the processor; and instructions stored in the memory and executable by the processor to cause the apparatus to perform the method of one or more of Aspects 10-18.

Aspect 25: A device for wireless communication, comprising a memory and one or more processors coupled to the memory, the one or more processors configured to perform the method of one or more of Aspects 10-18.

Aspect 26: An apparatus for wireless communication, comprising at least one means for performing the method of one or more of Aspects 10-18.

Aspect 27: A non-transitory computer-readable medium storing code for wireless communication, the code comprising instructions executable by a processor to perform the method of one or more of Aspects 10-18.

Aspect 28: A non-transitory computer-readable medium storing a set of instructions for wireless communication, the set of instructions comprising one or more instructions that, when executed by one or more processors of a device, cause the device to perform the method of one or more of Aspects 10-18.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A user equipment (UE) for wireless communication, comprising:
 a memory; and
 one or more processors, coupled to the memory, configured to:
  receive, from a base station, a physical downlink shared channel (PDSCH) transmission comprising one or more blocks, each block of the one or more blocks being received in either a half-duplexing mode or a full-duplexing mode;
  attempt to decode the PDSCH transmission using a low-density parity-check (LDPC) decoder; and
  transmit, to the base station, feedback that indicates a difference between a half-duplex channel quality and a full-duplex channel quality based at least in part on one or more decoding parameters associated with the LDPC decoder.

2. The UE of claim 1, wherein the one or more decoding parameters include a number of LDPC decoder iterations performed to decode the PDSCH transmission and information that indicates whether the PDSCH transmission was received in the half-duplexing mode or the full-duplexing mode.

3. The UE of claim 1, wherein the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

4. The UE of claim 1, wherein the one or more decoding parameters include a number of LDPC decoder iterations performed to decode one or more code block groups (CBGs) in the PDSCH transmission that were received in the half-duplexing mode and a number of LDPC decoder iterations performed to decode one or more CBGs in the PDSCH transmission that were received in the full-duplexing mode.

5. The UE of claim 1, wherein the one or more decoding parameters include an average number of LDPC decoder iterations performed to decode one or more code blocks (CBs) in the PDSCH transmission that were received in the half-duplexing mode and an average number of LDPC decoder iterations performed to decode one or more CBs in the PDSCH transmission that were received in the full-duplexing mode.

6. The UE of claim 1, wherein the one or more decoding parameters include a number of bit flips that occurred while using the LDPC decoder to decode the PDSCH transmission and information that indicates whether the PDSCH transmission was received in the half-duplexing mode or the full-duplexing mode.

7. The UE of claim 1, wherein the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

8. The UE of claim 1, wherein the one or more decoding parameters include a number of bit flips that occurred while using the LDPC decoder to decode one or more code block groups (CBGs) in the PDSCH transmission in the half-duplexing mode and a number of bit flips that occurred while using the LDPC decoder to decode one or more CBGs in the PDSCH transmission in the full-duplexing mode.

9. The UE of claim 1, wherein the one or more decoding parameters include an average number of bit flips that occurred while using the LDPC decoder to decode one or more code blocks (CBs) in the PDSCH transmission in the half-duplexing mode and an average number of bit flips that occurred while using the LDPC decoder to decode one or more CBs in the PDSCH transmission in the full-duplexing mode.

10. A base station for wireless communication, comprising:
 a memory; and
 one or more processors, coupled to the memory, configured to:
  transmit, to a user equipment (UE), a first physical downlink shared channel (PDSCH) transmission comprising one or more blocks, each block of the one or more blocks being transmitted in either a half-duplexing mode or a full-duplexing mode;

receive, from the UE, feedback that indicates a difference between a half-duplex channel quality and a full-duplex channel quality based at least in part on one or more decoding parameters associated with a low-density parity-check (LDPC) decoder used to decode the first PDSCH; and transmit, to the UE, a second PDSCH transmission comprising one or more blocks, each block of the one or more blocks being transmitted in either the half-duplexing mode or the full-duplexing mode using one or more transmission parameters that are based at least in part on the feedback that indicates the difference between the half-duplex channel quality and the full-duplex channel quality.

11. The base station of claim 10, wherein the one or more decoding parameters include a number of LDPC decoder iterations performed to decode the PDSCH transmission and information that indicates whether the PDSCH transmission was received in the half-duplexing mode or the full-duplexing mode.

12. The base station of claim 10, wherein the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

13. The base station of claim 10, wherein the one or more decoding parameters include a number of LDPC decoder iterations performed to decode one or more code block groups (CBGs) in the PDSCH transmission that were received in the half-duplexing mode and a number of LDPC decoder iterations performed to decode one or more CBGs in the PDSCH transmission that were received in the full-duplexing mode.

14. The base station of claim 10, wherein the one or more decoding parameters include an average number of LDPC decoder iterations performed to decode one or more code blocks (CBs) in the PDSCH transmission that were received in the half-duplexing mode and an average number of LDPC decoder iterations performed to decode one or more CBs in the PDSCH transmission that were received in the full-duplexing mode.

15. The base station of claim 10, wherein the one or more decoding parameters include a number of bit flips that occurred while using the LDPC decoder to decode the PDSCH transmission and information that indicates whether the PDSCH transmission was received in the half-duplexing mode or the full-duplexing mode.

16. The base station of claim 10, wherein the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

17. The base station of claim 10, wherein the one or more decoding parameters include a number of bit flips that occurred while using the LDPC decoder to decode one or more code block groups (CBGs) in the PDSCH transmission in the half-duplexing mode and a number of bit flips that occurred while using the LDPC decoder to decode one or more CBGs in the PDSCH transmission in the full-duplexing mode.

18. The base station of claim 10, wherein the one or more decoding parameters include an average number of bit flips that occurred while using the LDPC decoder to decode one or more code blocks (CBs) in the PDSCH transmission in the half-duplexing mode and an average number of bit flips that occurred while using the LDPC decoder to decode one or more CBs in the PDSCH transmission in the full-duplexing mode.

19. A method of wireless communication performed by a user equipment (UE), comprising:

receiving, from a base station, a physical downlink shared channel (PDSCH) transmission comprising one or more blocks, each block of the one or more blocks being transmitted in either a half-duplexing mode or a full-duplexing mode;

attempting to decode the PDSCH transmission using a low-density parity-check (LDPC) decoder; and transmitting, to the base station, feedback that indicates a difference between a half-duplex channel quality and a full-duplex channel quality based at least in part on one or more decoding parameters associated with the LDPC decoder.

20. The method of claim 19, wherein the one or more decoding parameters include a number of LDPC decoder iterations performed to decode the PDSCH transmission and information that indicates whether the PDSCH transmission was received in the half-duplexing mode or the full-duplexing mode.

21. The method of claim 19, wherein the one or more decoding parameters include a difference between a number of LDPC decoder iterations performed to decode one or more PDSCH transmissions in the half-duplexing mode and a number of LDPC decoder iterations performed to decode one or more PDSCH transmissions in the full-duplexing mode.

22. The method of claim 19, wherein the one or more decoding parameters include a number of LDPC decoder iterations performed to decode one or more code block groups (CBGs) in the PDSCH transmission that were received in the half-duplexing mode and a number of LDPC decoder iterations performed to decode one or more CBGs in the PDSCH transmission that were received in the full-duplexing mode.

23. The method of claim 19, wherein the one or more decoding parameters include an average number of LDPC decoder iterations performed to decode one or more code blocks (CBs) in the PDSCH transmission that were received in the half-duplexing mode and an average number of LDPC decoder iterations performed to decode one or more CBs in the PDSCH transmission that were received in the full-duplexing mode.

24. The method of claim 19, wherein the one or more decoding parameters include a number of bit flips that occurred while using the LDPC decoder to decode the PDSCH transmission and information that indicates whether the PDSCH transmission was received in the half-duplexing mode or the full-duplexing mode.

25. The method of claim 19, wherein the one or more decoding parameters include a difference between a number of bit flips that occurred while using the LDPC decoder to decode one or more PDSCH transmissions in the half-duplexing mode and a number of bit flips that occurred while using the LDPC decoder to decode one or more PDSCH transmissions in the full-duplexing mode.

26. The method of claim 19, wherein the one or more decoding parameters include a number of bit flips that occurred while using the LDPC decoder to decode one or more code block groups (CBGs) in the PDSCH transmission in the half-duplexing mode and a number of bit flips that occurred while using the LDPC decoder to decode one or more CBGs in the PDSCH transmission in the full-duplexing mode.

27. The method of claim 19, wherein the one or more decoding parameters include an average number of bit flips that occurred while using the LDPC decoder to decode one or more code blocks (CBs) in the PDSCH transmission in the half-duplexing mode and an average number of bit flips that occurred while using the LDPC decoder to decode one or more CBs in the PDSCH transmission in the full-duplexing mode.

28. A method of wireless communication performed by a base station, comprising:
   transmitting, to a user equipment (UE), a first physical downlink shared channel (PDSCH) transmission in one or more of a half-duplexing mode or a full-duplexing mode;
   receiving, from the UE, feedback that indicates a difference between a half-duplex channel quality and a full-duplex channel quality based at least in part on one or more decoding parameters associated with a low-density parity-check (LDPC) decoder used to decode the first PDSCH; and
   transmitting, to the UE, a second PDSCH transmission comprising one or more blocks, each block of the one or more blocks being transmitted in either the half-duplexing mode or the full-duplexing mode using one or more transmission parameters that are based at least in part on the feedback that indicates the difference between the half-duplex channel quality and the full-duplex channel quality.

29. The method of claim 28, wherein the one or more decoding parameters include a number of LDPC decoder iterations performed to decode the PDSCH transmission and information that indicates whether the PDSCH transmission was received in the half-duplexing mode or the full-duplexing mode.

30. The method of claim 28, wherein the one or more decoding parameters relate to one or more of a number of LDPC decoder iterations or a number of bit flips associated with decoding one or more PDSCH transmissions in one or more of the half-duplexing mode or the full-duplexing mode.

* * * * *